(12) United States Patent
Goda et al.

(10) Patent No.: US 6,819,590 B2
(45) Date of Patent: Nov. 16, 2004

(54) SEMICONDUCTOR MEMORY

(75) Inventors: Akira Goda, Yokohama (JP); Mitsuhiro Noguchi, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 185 days.

(21) Appl. No.: 10/106,358

(22) Filed: Mar. 27, 2002

(65) Prior Publication Data

US 2002/0141237 A1 Oct. 3, 2002

(30) Foreign Application Priority Data

Mar. 30, 2001 (JP) .................................. 2001-100148

(51) Int. Cl.$^7$ ............................................. G11C 16/00
(52) U.S. Cl. ............................. 365/185.03; 365/185.17
(58) Field of Search ....................... 365/185.03, 185.05, 365/185.17

(56) References Cited

U.S. PATENT DOCUMENTS

| | | | |
|---|---|---|---|
| 5,814,855 A | | 9/1998 | Arase et al. ................. 257/315 |
| 5,847,992 A | * | 12/1998 | Tanaka et al. .......... 365/185.03 |
| 5,894,435 A | * | 4/1999 | Nobukata .............. 365/185.03 |
| 6,191,445 B1 | | 2/2001 | Fujiwara ..................... 257/321 |

OTHER PUBLICATIONS

Shin–ichi Minami, et al., "A Novel MONOS Nonvolatile Memory Device Ensuring 10–Year Data Retention After 10$^7$ Erase/Write Cycles", IEEE Transactions on Electron Devices, vol. 40, No. 11, Nov. 1993, pp. 2011–2017.

Shin–ichi Minami, et al., "New Scaling Guidelines for MNOS Nonvolatile Memory Devices", IEEE Transactions on Electron Devices, vol. 38, No. 11, Nov. 1991, pp. 2519–2526.

* cited by examiner

Primary Examiner—Tan T. Nguyen
(74) Attorney, Agent, or Firm—Oblon, Spivak, McClelland, Maier & Neustadt, P.C.

(57) ABSTRACT

Each of a plurality of memory elements of a semiconductor memory includes at least one control terminal which switches the ON state and OFF state of the current path between the current terminals, and an information storage portion interposed between the current path and the control terminal to provide a threshold voltage. This information storage portion selectively stores electrically erasable and programmable discrete N-valued (N is an integer of 2 or more) data. As the threshold voltage, the information storage portion provides first to Nth threshold voltages which are discrete in ascending order of voltage in correspondence with the N-valued data. All the first to Nth threshold voltages of the plurality of memory elements are higher than the lower one of voltages applied to the current terminals in data read.

54 Claims, 25 Drawing Sheets

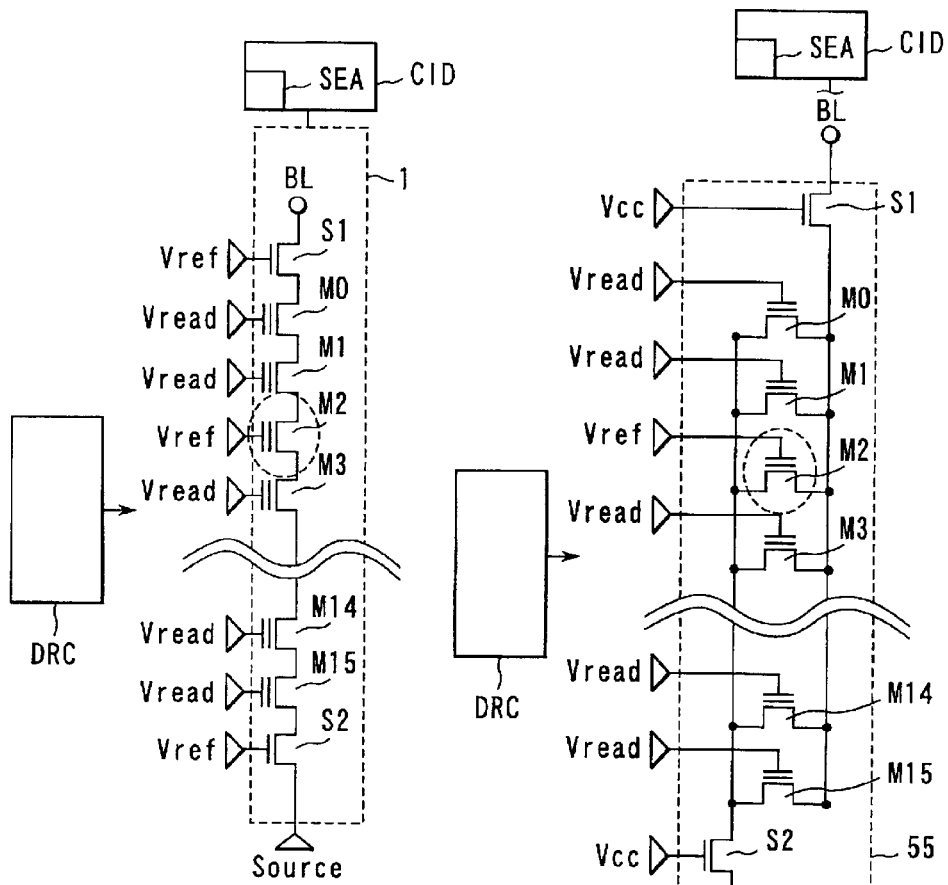
FIG. 10A
FIG. 10B
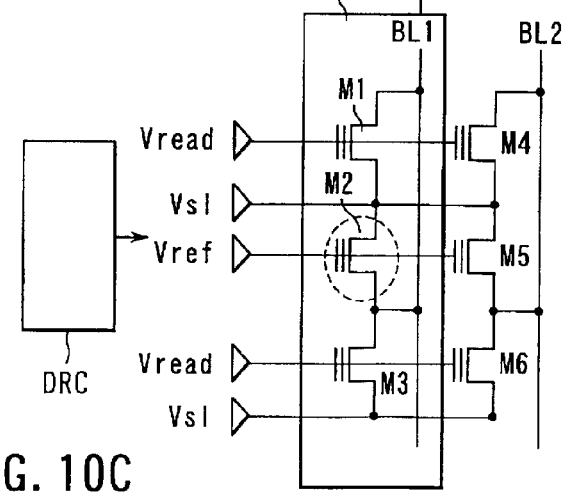
FIG. 10C

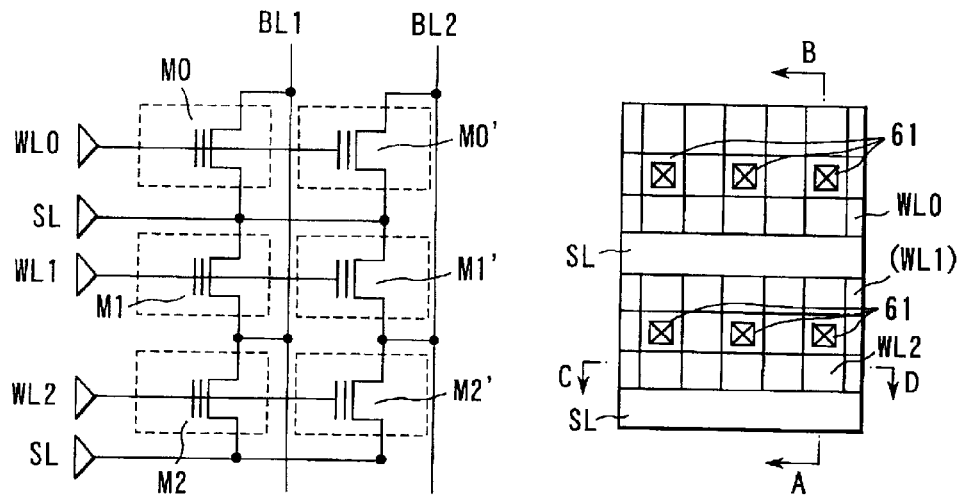
FIG. 14A
FIG. 14B
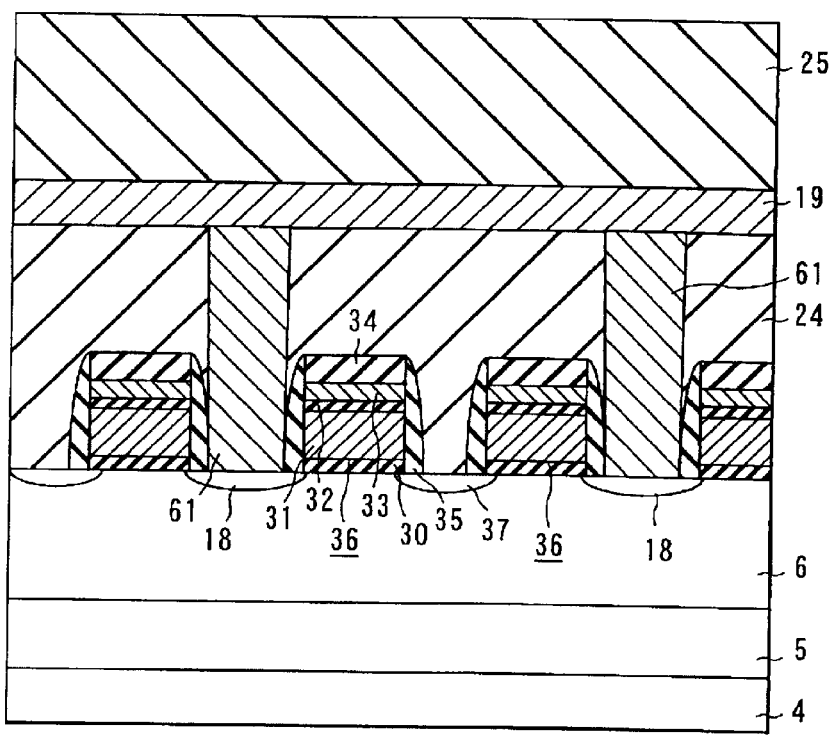
FIG. 15

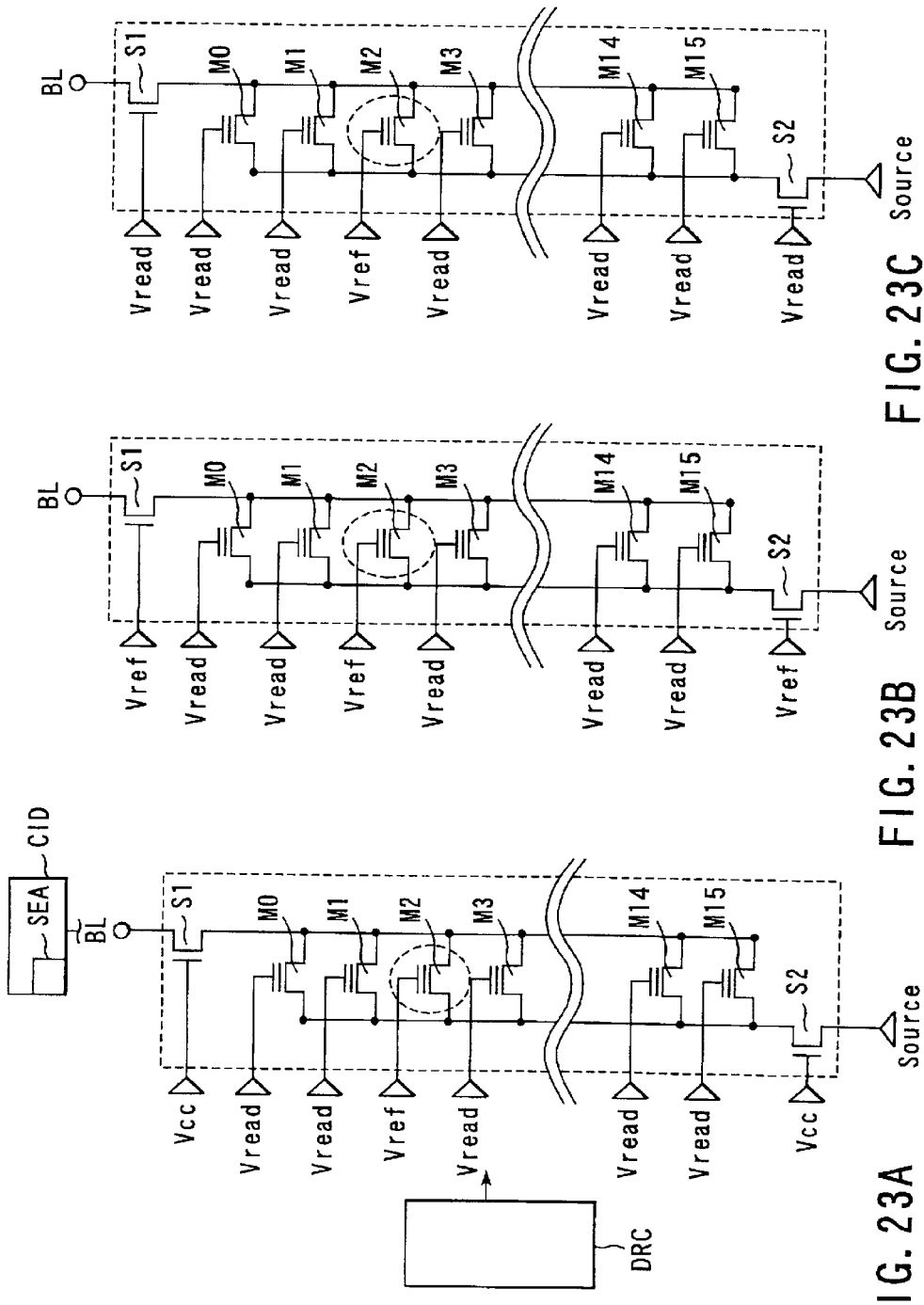

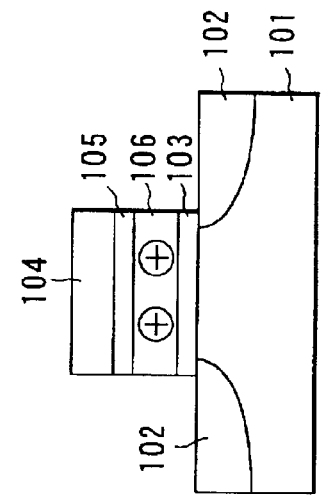
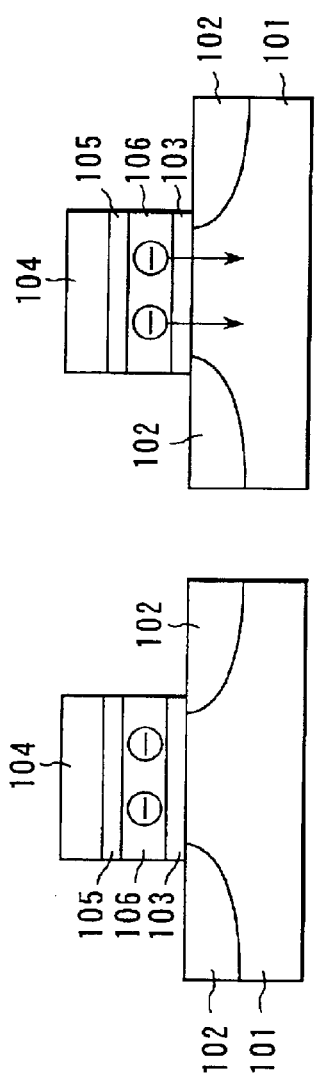
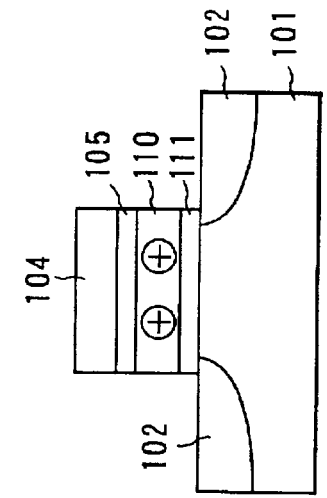
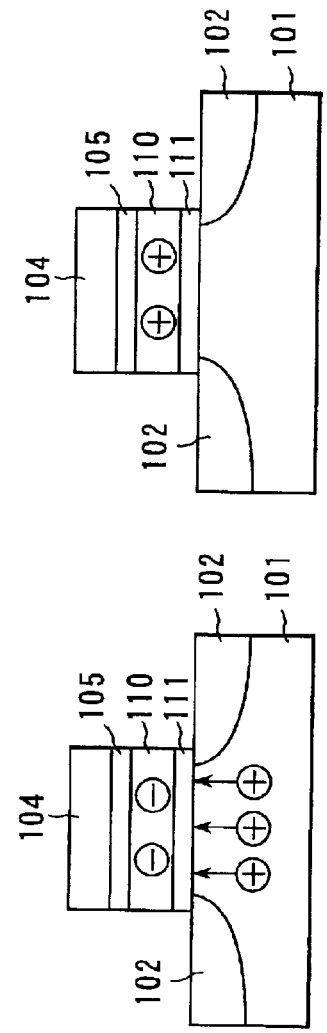
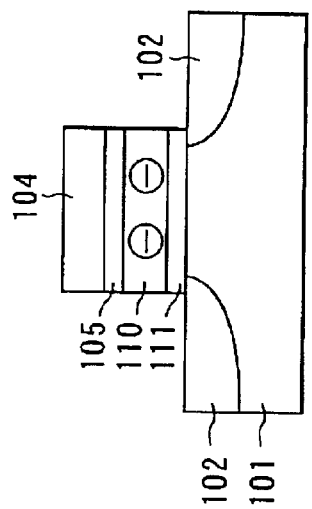

SEMICONDUCTOR MEMORY

CROSS-REFERENCE TO RELATED APPLICATIONS

This application is based upon and claims the benefit of priority from the prior Japanese Patent Application No. 2001-100148, Mar. 30, 2001, the entire contents of which are incorporated herein by reference.

BACKGROUND OF THE INVENTION

1. Field of the Invention

The present invention relates to a semiconductor memory and, more particularly, to an electrically erasable and programmable semiconductor memory.

2. Description of the Related Art

As an electrically erasable and programmable nonvolatile semiconductor memory, a device having a MISFET structure in which a charge storage layer and a control gate electrode are stacked on a semiconductor substrate is known. Examples of devices of this type are a floating gate type nonvolatile semiconductor memory and a MONOS type nonvolatile semiconductor memory. MONOS represents "Metal-Oxide-Nitride-Oxide-Semiconductor", and typically represents "metal-silicon oxide film-silicon nitride film-silicon oxide film-semiconductor".

FIGS. 25A to 25C are schematic views showing an erase operation in a memory cell of a conventional floating gate type nonvolatile semiconductor memory. As shown in FIGS. 25A to 25C, source/drain diffusion layers 102 are formed in the surface of a semiconductor substrate 101. On this semiconductor substrate 101, a floating gate layer 106 is formed via a tunnel insulating film 103. On this floating gate layer 106, a control gate electrode 104 is formed via an inter-poly-Si insulating film 105.

FIG. 25A shows a state in which the floating gate layer 106 is negatively charged. In this state, as shown in FIG. 25B, this negative charge is extracted from the floating gate layer 106 to the semiconductor substrate 101. Consequently, as shown in FIG. 25C, the floating gate layer 106 is positively charged to perform an erasing action.

FIGS. 26A to 26C are schematic views showing an erase operation in a memory cell of a conventional MONOS type nonvolatile semiconductor memory. As shown in FIGS. 26A to 26C, source/drain diffusion layers 102 are formed in the surface of a semiconductor substrate 101. On this semiconductor substrate 101, a charge storage layer 110 is formed via a tunnel insulating film 111. On this charge storage layer 110, a control gate electrode 104 is formed via a block insulating film 105.

FIG. 26A shows a state in which the charge storage layer 110 is negatively charged. In this state, as shown in FIG. 26B, positive charge is injected into the charge storage layer 110 from the semiconductor substrate 101. Consequently, as shown in FIG. 26C, the charge storage layer is positively charged to perform an erasing action. This operation is called direct tunneling of positive charge. In this operation, as the thickness of the tunnel insulating film 111 increases, it becomes more difficult for positive charge to enter the charge storage layer. However, the tunnel insulating film is preferably thick for the sake of the data retention characteristic.

FIG. 27A is a graph showing threshold voltage distributions in data storage states (an erased state D1 and a written state D2) in a conventional nonvolatile semiconductor memory. FIGS. 27B and 27C are schematic views showing the written state and erased state, respectively, which correspond to the distributions in FIG. 27A, of a memory cell.

A nonvolatile semiconductor memory usually changes the threshold voltage of a memory cell transistor by a charge amount stored in a charge storage layer, thereby storing a written state and erased state. A state in which the charge amount in the charge storage layer is 0 is called a neutral state, and the threshold voltage of the memory cell transistor in this state is a neutral threshold voltage Vthi. A state in which positive charge is stored in the charge storage layer is an erased state, and a state in which negative charge is stored is a written state. These states are common to NAND, AND, and NOR memories.

Referring to FIG. 27A, the abscissa indicates the number of memory cells, and the ordinate indicates the threshold voltage. In the erased state D1, all the threshold voltages of the memory cells are distributed at values smaller than Vthi. In the written state D2, all the threshold voltages of the memory cells are distributed at values larger than Vthi. As shown in FIG. 27B, data write is performed by, e.g., applying a high voltage (e.g., 10 to 25 V) to a control gate electrode 104 with a semiconductor substrate 101 set at 0 V, thereby injecting negative charge into a charge storage layer 110 from the semiconductor substrate 101. Alternatively, data is written by biasing the drain potential positively with respect to the source potential to generate hot electrons accelerated by the channel, and biasing the control gate electrode 104 positively with respect to the source potential to inject these hot electrons into the charge storage layer.

As shown in FIG. 27C, data is erased by, e.g., applying a high voltage (e.g., 8 to 25 V) to the semiconductor substrate 101, with the control gate electrode 104 set at 0 V, thereby releasing negative charge from the charge storage layer 110 to the semiconductor substrate 101, or thereby injecting positive charge into the charge storage layer 110 from the semiconductor substrate 101. Alternatively, data is erased by biasing the source or drain, or the source/drains positively with respect to the well, and biasing the control gate electrode negatively with respect to the well, to inject hot holes into the charge storage layer 110.

FIG. 28 is a graph showing threshold voltage distributions in data storage states (an erased state D1 and a written state D2) in a conventional NAND memory cell. FIG. 29 is a circuit diagram for explaining a read operation in this conventional NAND memory cell. The data storage states and read operation in a NAND EEPROM as a representative nonvolatile semiconductor memory will be explained with reference to FIGS. 28 and 29.

In a general NAND EEPROM, a state in which the threshold voltage of a memory cell is higher than 0 V is a written state, and a state in which the threshold voltage of a memory cell is lower than 0 V is an erased state. Referring to FIG. 28, the abscissa indicates the number of memory cells, and the ordinate indicates the threshold voltage. In the erased state D1 (the state shown in FIG. 27C), all the threshold voltages of the memory cells are distributed at values smaller than Vthi and a threshold voltage Vthsg of a selection transistor. In the written state D2 (the state shown in FIG. 27B), all the threshold voltages of the memory cells are distributed at values larger than Vthi and Vread.

As shown in FIG. 29, in a read operation of a NAND EEPROM, a bit line BL is set to float after being precharged, and a source line Source is set at 0 V. In this state, the voltage of the control gate electrode of a memory cell M2 selected for data read is set at a read voltage of 0 V, the voltages of the control gate electrodes of other memory cells M0, M1, and M3 to M31 are set at a non-selection read voltage Vread, and the gate voltages of selection transistors S1 and S2 are set at a power supply voltage Vcc. Data is read by detecting, by the bit line BL, whether an electric current flows through the memory cell M2 selected for data read.

In the written state in which the threshold voltage Vth of the memory cell M2 selected for data read is positive, this memory cell M2 is turned off, so the bit line BL maintains the precharge voltage. On the other hand, in the read state in which the threshold voltage Vth of the memory cell M2 selected for data read is negative, this memory cell M2 is turned on, so the potential of the bit line BL lowers from the precharge potential by $\Delta V$. Data in this memory cell M2 is read out by sensing this potential change by a sense amplifier.

BRIEF SUMMARY OF THE INVENTION

According to an aspect of the present invention, there is provided a semiconductor memory comprising a plurality memory elements, which are connected between at least two current terminals, and each of which comprises:

- at least one control terminal which switches a ON state and OFF state of a current path between the current terminals; and
- an information storage portion interposed between the current path and the control terminal to provide a threshold voltage which is a voltage of the control terminal when the ON state and OFF state of the current path are switched,
- wherein the information storage portion selectively stores electrically erasable and programmable discrete N-valued (N is an integer of not less than 2) data,
- the information storage portion provides, as the threshold voltage, first to Nth threshold voltages which are discrete in ascending order of voltage in correspondence with the N-valued data,
- all the first to Nth threshold voltages of the plurality of memory elements are higher than the lower one of voltages applied to the current terminals in data read, and
- a voltage higher than the Nth threshold voltage is applied to at least one control terminal of the plurality of memory elements in data read.

BRIEF DESCRIPTION OF THE SEVERAL VIEWS OF THE DRAWING

FIG. 10A is a circuit diagram showing a NAND EEPROM as a semiconductor memory according to the second embodiment of the present invention;

FIG. 10B is a circuit diagram showing an AND EEPROM as another semiconductor memory according to the second embodiment of the present invention;

FIG. 10C is a circuit diagram showing a NOR EEPROM as still another semiconductor memory according to the second embodiment of the present invention;

FIGS. 14A and 14B are an equivalent circuit diagram and a plan view, respectively, showing a NOR EEPROM according to the first modification of the second embodiment of the present invention;

FIG. 15 is a sectional view taken along a line A-B in FIG. 14B, in which a memory cell is a floating gate type memory cell;

FIG. 23A is a circuit diagram showing an AND EEPROM as another semiconductor memory according to the third embodiment of the present invention;

FIGS. 23B and 23C are circuit diagrams showing an AND EEPROM according to a modification of the third embodiment;

FIGS. 25A, 25B, and 25C are schematic views showing an erase operation in a memory cell of a conventional floating gate type nonvolatile semiconductor memory;

FIGS. 26A, 26B, and 26C are schematic views showing an erase operation in a memory cell of a conventional MONOS type nonvolatile semiconductor memory;

DETAILED DESCRIPTION OF THE INVENTION

In the course of developing the present invention, the present inventors studied causes of destruction of stored data, particularly, read disturb, in conventional nonvolatile semiconductor memories as described with reference to FIGS. 25A to 29. As a result, the present inventors obtained the findings as stated below.

Figure 30A:
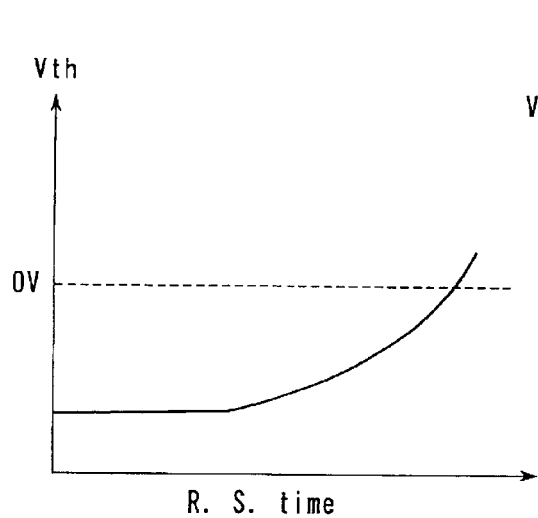
FIGS. 30A and 30B are graphs showing a change in the threshold voltage of a conventional NAND memory cell in a non-selected state, and changes in data storage states (an erased state and written state) of the memory cell, respectively.
Figure 30B:
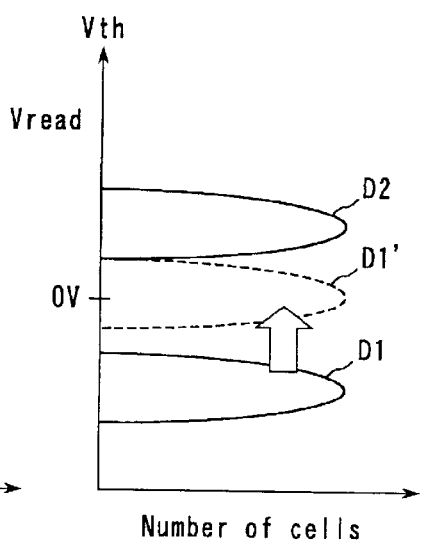

FIGS. 30A and 30B are graphs showing a change in the threshold voltage of a conventional NAND type memory cell in a non-selected state, and changes in data storage states (an erased state D1 and a written state D2) of the memory cell, respectively. Referring to FIG. 30A, the abscissa indicates a read stress application time (R.S. TIME), and the ordinate indicates a threshold voltage Vth of the non-selected cell. Referring to FIG. 30B, the abscissa indicates the number of memory cells, and the ordinate indicates the threshold voltage. In FIG. 30B, the erased state D1 and the written state D2 indicate the threshold voltages (distributions) of the memory cell immediately after data is written and erased, respectively.

In a memory cell left to stand after data is stored, electric charge decreases as it is gradually discharged, and the charge amount finally converges to 0. The larger the amount of electric charge, positive or negative, in the initial state, the larger the reduction in this charge amount. Generally, data write to a semiconductor memory is performed when the charge amount is small, in which state the gradient of a change in electric charge is small.

Figure 27A:
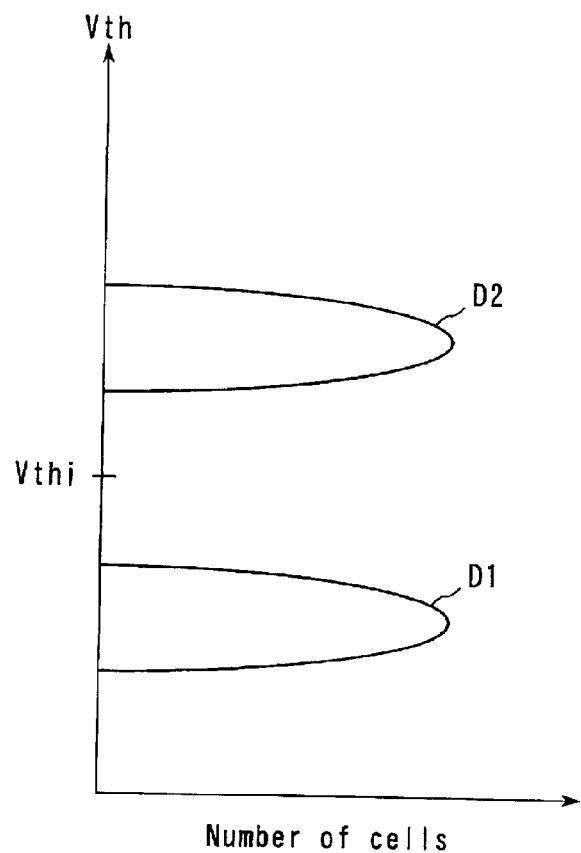
FIG. 27A is a graph showing threshold voltage distributions in data storage states (an erased state and written state) in a conventional nonvolatile semiconductor memory.
Figure 27B:
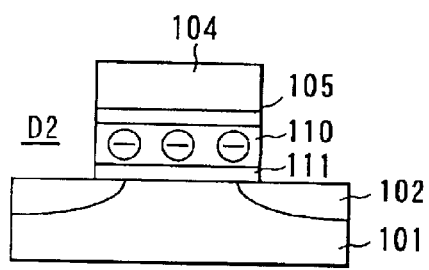
FIGS. 27B and 27C are schematic views showing the written state and erased state, respectively, which correspond to the distributions shown in FIG. 27A, of a memory cell.
Figure 27C:
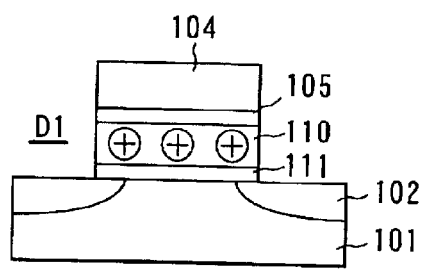
Figure 28:
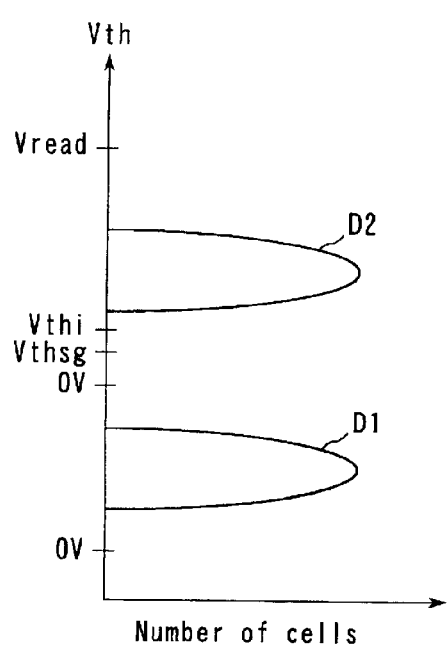
FIG. 28 is a graph showing threshold voltage distributions in data storage states (an erased state and written state) in a conventional NAND memory cell.
Figure 29:
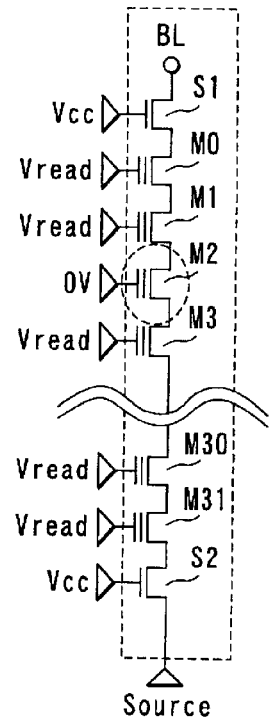
FIG. 29 is a circuit diagram for explaining a read operation in the conventional NAND memory cell.

As shown in FIGS. 27A to 27C, data is stored in a conventional EEPROM such that a negative charge stored state and a positive charge storage state correspond to a written state and an erased state, respectively. Especially in a NAND EEPROM, as shown in FIG. 28, data is stored such that states in which the threshold voltage of a memory cell is positive and negative correspond to a written state and an erased state, respectively.

In a read operation of a NAND EEPROM, a non-selected memory cell must be turned on regardless of its storage state, so a voltage Vread higher than a write threshold voltage is applied to the control gate electrode. As shown in FIG. 30B, a non-selected memory cell indicated by the solid line immediately after erasing is in the erased state D1, i.e., in the state in which the threshold voltage is negative. When a read operation is repeated in this state, the threshold voltage rises owing to the Vread stress and destroys the data. Consequently, the threshold voltage becomes positive as indicated by a broken line D1' in FIG. 30B. This is called read disturb. That is, as shown in FIGS. 30A and 30B, a cell not selected for data read is constantly exposed to the Vread stress, so its threshold voltage gradually rises.

If the retained electric charge of a memory cell is positive, particularly the data retention characteristic worsens under any of the following conditions. This problem becomes more serious as micropatterning of memory cells advances. The problem will be explained below.

That is, with the advancing micropatterning of nonvolatile semiconductor memories, demands for lowering the write/erase voltage are increasing. This is so because the influence the area of peripheral circuits for handling the write/erase voltage has on the entire semiconductor chip increases. If the write/erase voltage remains high, the area of peripheral circuits is not decreased. Therefore, this peripheral circuit area relatively increases if cells are micropatterned. In this way, the peripheral circuit area limits a reduction in the area of the whole semiconductor chip.

To realize this in a floating gate type memory cell, it is effective to increase the coupling ratio and decrease the thickness of a tunnel oxide film. Let Vpp be the voltage applied between the control gate electrode and the channel during write and erase, Eox be the electric field applied to the tunnel oxide film, d be the thickness of the tunnel oxide film, C1 be the capacitance between the semiconductor substrate and the floating gate layer, and C2 be the capacitance between the floating gate layer and the control gate electrode. In this case, a coupling ratio y has a value obtained by dividing C2 by the sum of C1 and C2. If Vth=Vthi, we have the following formula (1).

$$V_{pp} \neq (d/\gamma) \times E_{ox} \qquad (1)$$

Therefore, to lower the program voltage Vpp while Eox is maintained (while the write and erase rates are held), it is necessary to decrease the tunnel oxide film thickness d or increase the coupling ratio γ.

Letting E'ox denote the electric field applied to the tunnel oxide film of a non-selected memory cell during data read, if Vth=Vthi, we have the following formula (2).

$$E'_{ox} \neq (\gamma/d) \times V_{read} \qquad (2)$$

Accordingly, if the coupling ratio γ is increased and the tunnel oxide film thickness d is decreased to lower the voltage Vpp applied between the control gate electrode and the channel, E'ox increases, and this worsens the read disturb characteristic. That is, read disturb is caused by a leak of the tunnel oxide film, and the leakage current increases if E'ox, i.e., the oxide film electric field increases.

A nonvolatile semiconductor memory using an insulating film such as a silicon nitride film as a charge storage layer is also present. A general characteristic feature of this memory is that the write/erase voltage Vpp is low. However, as described in U.S. Pat. No. 6,191,445, a threshold voltage fluctuation occurs even at a low control gate electrode voltage of 2.5 V or less.

Also, Minami et al. report that when a cell using SiN as a charge storage layer is repeatedly programmed, holes stored during erasing deteriorate the reliability (Shinichi Minami and Yoshiaki Kamigaki, "A Novel MONOS Nonvolatile Memory Device Ensuring 10-Year Data Retention after 107 Erase/Write Cycles", IEEE TRANSACTIONS ON ELECTRON DEVICES, Vol. 40, No. 11, pp. 2011–2017, November 1993). The characteristics of MONOS deteriorate significantly if the thickness of the charge storage layer is decreased and stress is exerted for long time periods.

Furthermore, Minami et al. report that as to deterioration of the data retention characteristic caused by repetitive programming in a cell using SiN as a charge storage layer, only the hole stored state deteriorates by repetitive programming, and the electron stored state does not deteriorate (Shinichi Minami and Yoshiaki Kamigaki, "New Scaling Guidelines for MONOS Nonvolatile Memory Devices", IEEE TRANSACTIONS ON ELECTRON DEVICES, Vol. 38, No. 11, pp. 2519–2526, November 1991").

Embodiments of the present invention constituted on the basis of the above findings will be described below with reference to the accompanying drawing. In the following description, the same reference numerals denote constituent elements having substantially the same functions and arrangements, and a duplicate explanation thereof will be made only where necessary. Also, the views are schematic, so the relationship between the thicknesses and the planar dimensions, the ratio of the thicknesses of individual layers, and the like are different from real ones. Accordingly, practical thicknesses and dimensions should be recognized with reference to the following explanation. Furthermore, different views contain portions different in dimensional relationship and ratio.

Figure 31:
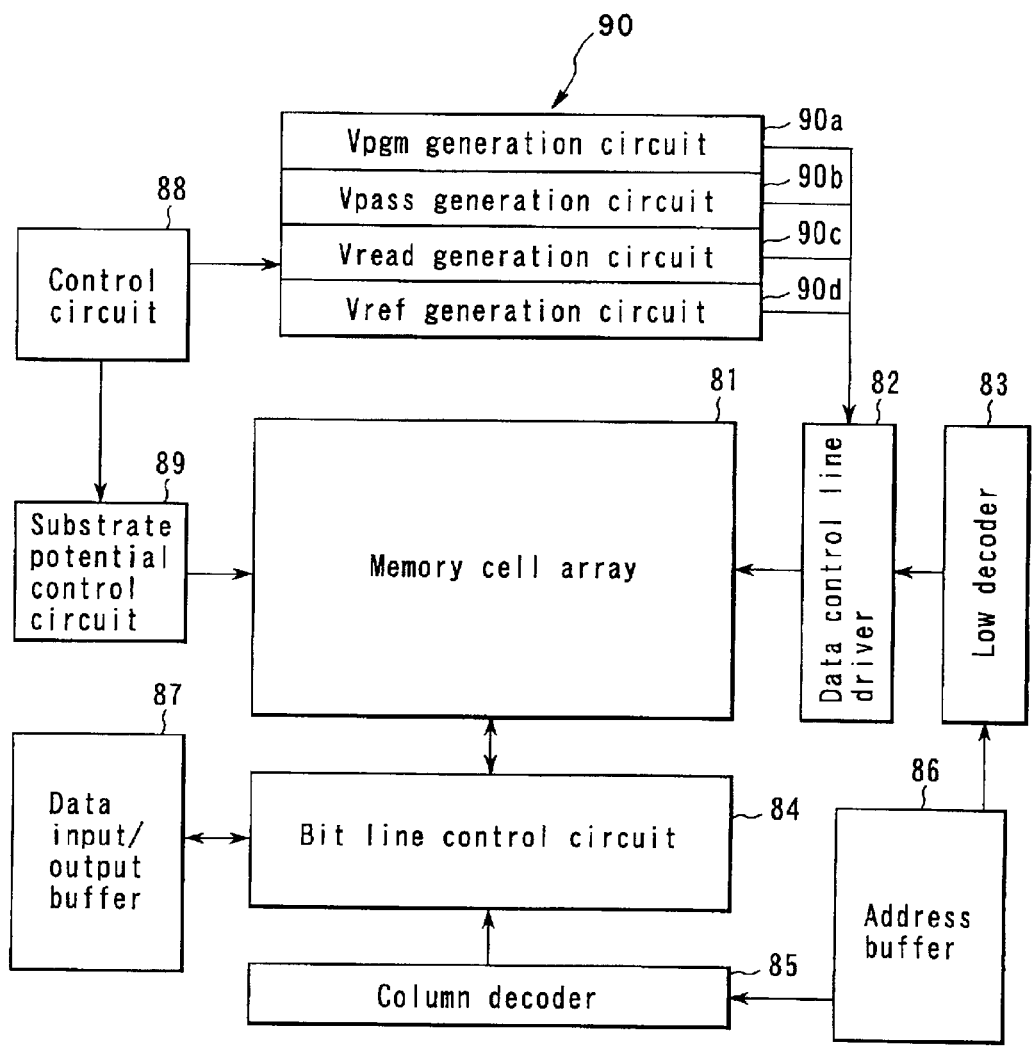
FIG. 31 is a block diagram showing a NAND EEPROM as a semiconductor memory according to embodiments of the present invention.

FIG. 31 is a block diagram showing a NAND EEPROM as a semiconductor memory according to embodiments of the present invention.

This semiconductor memory has a memory cell array 81, which includes NAND-cell blocks disposed in a matrix format, each NAND-cell block being formed of nonvolatile memory cells connected in series. A bit line control circuit 84 is arranged to sense data of bit lines or to hold write data, for the memory cell array 81. The bit line control circuit 84 includes a sense amplifier circuit and a data latch circuit, and is constituted mainly of, e.g., flip flop circuits.

The bit line control circuit 84 is connected to a data input/output buffer 87. The connection is controlled by the output of a column decoder 85, which decodes address signals from an address buffer 86. With this arrangement, data given to a data input/output I/O can be written in the memory cell array 81, and data in the memory cell array 81 can be read out of the I/O.

A row decoder 83 and a data control line driver 82 are arranged to perform memory cells selection of the memory cell array 81, and, specifically, to control data control lines (which may be referred to as word lines) WL and selection gate lines SSL and GSL. The data control line driver 82 applies the necessary control voltage to the data control lines and the selection gate lines in accordance with selection caused by the decoded output of the row decoder 83.

A substrate potential control circuit 89 is arranged to control the potential of a substrate region (a p-well in general) in which the memory cell array 81 is formed. Specifically, the substrate potential control circuit 89 is controlled by a control circuit 88 to generate a ground potential GND during data writing and data reading, and an erase voltage during data erasing.

An internal voltage generation circuit 90 is arranged to generate various kinds of internal voltages. The internal voltage generation circuit 90 is controlled by the control circuit 88 to apply the necessary voltage to a selected memory cell of the memory cell array 81, during data writing or reading. More specifically, the internal voltage generation circuit 90 includes a writing voltage (Vpgm) generation circuit 90*a*, a Vpass generation circuit 90*b* for generating a pass voltage (Vpass) in writing, a Vread generation circuit 90*c* for generating a pass voltage (Vread) in reading (including verify reading), and a reading voltage (Vref) generation circuit 90*d*. The pass voltage Vpass in writing and the pass voltage Vread in reading are lower than the writing voltage Vpgm, but they are voltages increased from a power supply voltage Vcc.

The structure shown in FIG. 31 is common to NAND EEPROMs according to embodiments of the present invention described below. Furthermore, the relationship between the memory cell array 81 and the control section around the memory cell array 81 is common to semiconductor memories of different types according to embodiments of the present invention described below.

First Embodiment

Figure 1A:
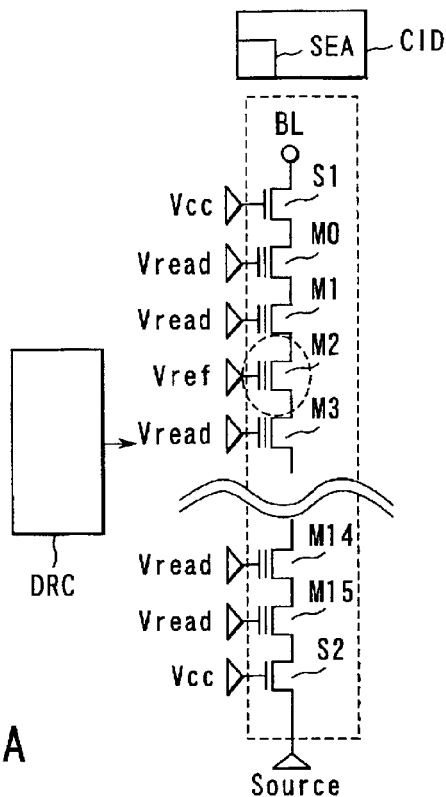
FIG. 1A is a circuit diagram showing a NAND EEPROM as a semiconductor memory according to the first embodiment of the present invention.

FIG. 1A is a circuit diagram showing a NAND EEPROM as a semiconductor memory according to the first embodiment of the present invention.

This memory cell block has a first selection transistor S1 having a terminal connected to a bit line BL, and a second selection transistor S2 having a terminal connected to a source line Source. Between these selection transistors S1 and S2, 16 memory cell transistors M0 to M15 are connected in series. A driver/controller DRC supplies various voltages applied in manners to be described later to the bit line BL, the source line Source, and the transistors S1, S2, and M0 to M15.

Each memory cell transistor has a control terminal (control gate electrode) which switches the ON state and OFF state of the current path (channel) between the bit line BL and the source line Source. Each memory cell transistor also has an information storage portion (charge storage layer) interposed between the current path (channel) and the control terminal (control gate electrode). This information storage portion provides a threshold voltage which is the voltage of the control terminal when the ON state and OFF state of the current path are switched. The information storage portion selectively stores electrically erasable and programmable discrete N-valued (N is an integer of 2 or more) data. As the threshold voltage, this information storage portion provides first to Nth threshold voltages which are discrete in ascending order of voltage, in accordance with the N-valued data.

All the first to Nth threshold voltages of the memory cells are higher than a voltage (0V) applied to the source lines in data read. Furthermore, in data read, a non-selection read voltage Vread, which is higher than the Nth threshold voltage, is applied to the control terminals (the control gate electrodes) of non-selected memory cells in a NAND memory cell block selected for data read.

A read operation in the device shown in FIG. 1A is as follows. That is, the bit line BL is set to float after being precharged, and the source line Source is set at 0 V. In this state, the voltage of the control gate electrode of the memory cell (transistor) M2 selected for data read is set at a read voltage Vref, the voltages of the control gate electrodes of the other memory cells M0, M1, and M3 to M15 are set at a non-selection read voltage Vread, and the gate voltages of the first and second selection transistors S1 and S2 are set at a power supply voltage Vcc. Data is read by checking, by the bit line BL, whether an electric current flows through the memory cell M2 selected for data read.

If a threshold voltage Vth of this memory cell M2 selected for data read is larger than the read voltage Vref, the memory cell M2 is turned off, so the bit line BL maintains the precharge voltage. If the threshold voltage Vth of the memory cell M2 selected for data read is smaller than the read voltage Vref, the memory cell M2 is turned on. Accordingly, the potential of the bit line BL lowers from the precharge potential by a voltage drop ΔV in this memory cell block. Data in the memory cell M2 is read out by sensing this potential change by a sense amplifier SEA in a data circuit CID connected to the bit line.

The read voltage Vref is intermediate between a threshold voltage in a written state and that in an erased state. The non-selection read voltage Vread is higher than the threshold voltage in a written state. The power supply voltage Vcc is higher than the threshold voltage of the selection transistor.

Figure 1B:
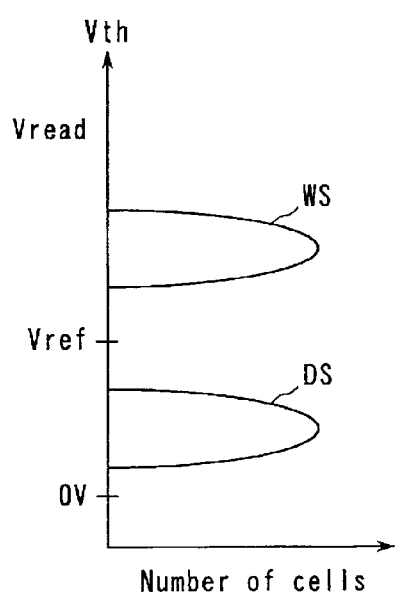
FIGS. 1B and 1C are graphs showing two examples of threshold voltage distributions corresponding to data storage states (an erased state and written state) in the memory according to the first embodiment.
Figure 1C:
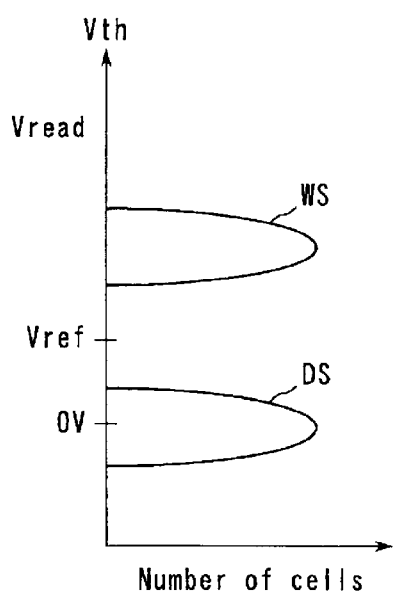

FIGS. 1B and 1C are graphs showing two examples of threshold voltage distributions corresponding to data storage states (an erased state DS and a written state WS) in the device according to the first embodiment. Referring to FIGS. 1B and 1C, the abscissa indicates the number of memory cell transistors, and the ordinate indicates the magnitude of the threshold voltage.

The example shown in FIG. 1B is characterized in that both the erased state DS and the written state WS of a memory cell have positive threshold voltages. In the erased state DS, all the threshold voltages of the memory cells are distributed at values larger than 0 V and smaller than the read voltage Vref. In the written state WS, all the threshold voltages of the memory cells are distributed at values larger than the read voltage Vref and smaller than the non-selection read voltage Vread.

The characteristic feature of the example shown in FIG. 1C is that in the erased state DS, the threshold voltages of the memory cells are distributed at values which are both positive and negative on the two sides of 0 V and smaller than the read voltage Vref. In the written state WS, all the threshold voltages of the memory cells are distributed at values larger than the read voltage Vref and smaller than the non-selection read voltage Vread.

As shown in FIG. 30A, when data read is repeated the threshold voltage of a non-selected cell rises owing to the stress caused by the non-selection read voltage Vread. Therefore, a threshold voltage for data storage and various other voltages must be set by taking this into consideration.

Figure 2A:
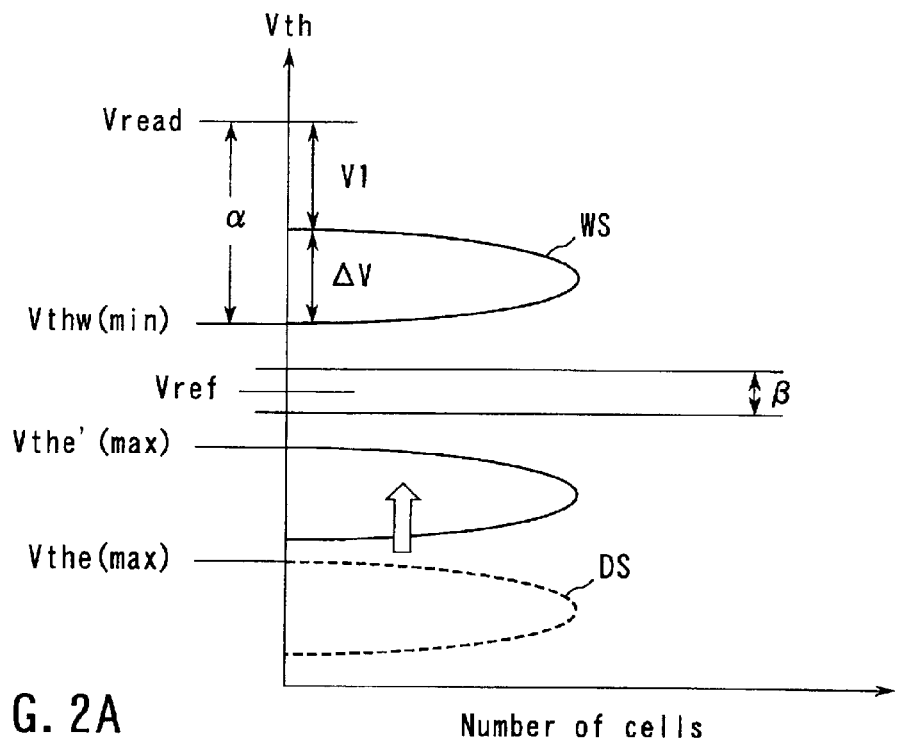
FIG. 2A is a graph showing threshold voltage distributions set by taking account of read disturb in the memory according to the first embodiment.

FIG. 2A is a graph showing threshold voltage distributions set by taking account of read disturb in the device according to the first embodiment. Referring to FIG. 2A, the abscissa indicates the number of memory cell transistors, and the ordinate indicates the threshold voltage.

Let Vthw(min) denote the lowest threshold voltage of memory cells in the written state WS, and ΔV denote the distribution width of threshold voltages in the written state (ΔV is generally about 0.4 V). To obtain a cell current enough to increase the speed of read operation, the non-selection read voltage Vread must be high enough to well turn on a memory cell having the highest threshold voltage. Also, since the cell current increases as the gate voltage rises, the gate voltage must be high enough to increase the cell current. Let V1 denote this margin. Generally, V1 is desirably about 1 V. In this case, we have the following equation (3).

$$\text{Vread} = V thw(\min) + \Delta V + V1 \qquad (3)$$

Letting α be the sum of ΔV and V1, we have the following equations (4) and (5) which are equal to each other.

$$\text{Vread} = V thw(\min) + \alpha \qquad (4)$$

$$V thw(\min) = \text{Vread} - \alpha \qquad (5)$$

In addition, let Vthe(max) be the highest threshold voltage of memory cells in the erased state DS. When a read operation is repeatedly performed, that threshold voltage in the erased state DS which is indicated by the broken line in FIG. 2A gradually rises. After stress by the non-selection read voltage Vread at a certain time, Vthe(max) becomes Vthe'(max), showing a distribution indicated by the solid line. The longer the non-selection read voltage Vread stress time, the more Vthe'(max) rises. This non-selection read voltage Vread stress time is determined by the specifications guaranteeing the reliability of a nonvolatile semiconductor memory. For example, the stress time is the product of the read time and the number of times of data read which guarantees a 10-year operation.

Even after the thus determined non-selection read voltage Vread stress, the threshold voltage distributions in the written state and erased state must be separated. Letting β denote a margin for this separation, the following formula (6) must be satisfied.

$$V thw(\min) - V the'(\max) > \beta \qquad (6)$$

β is determined by the operation margin of a sense amplifier and generally about 0.4 V.

The present inventors investigated the relationship between the erased-state threshold voltage, non-selection read voltage, and non-selection read voltage stress time in a nonvolatile semiconductor memory. As a result of this investigation, the present inventors have found that the erased-state threshold voltage Vthe' after a sufficiently long read stress is independent of the initial erased-state threshold voltage Vthe and is determined solely by the non-selection read voltage Vread.

Figure 2B:
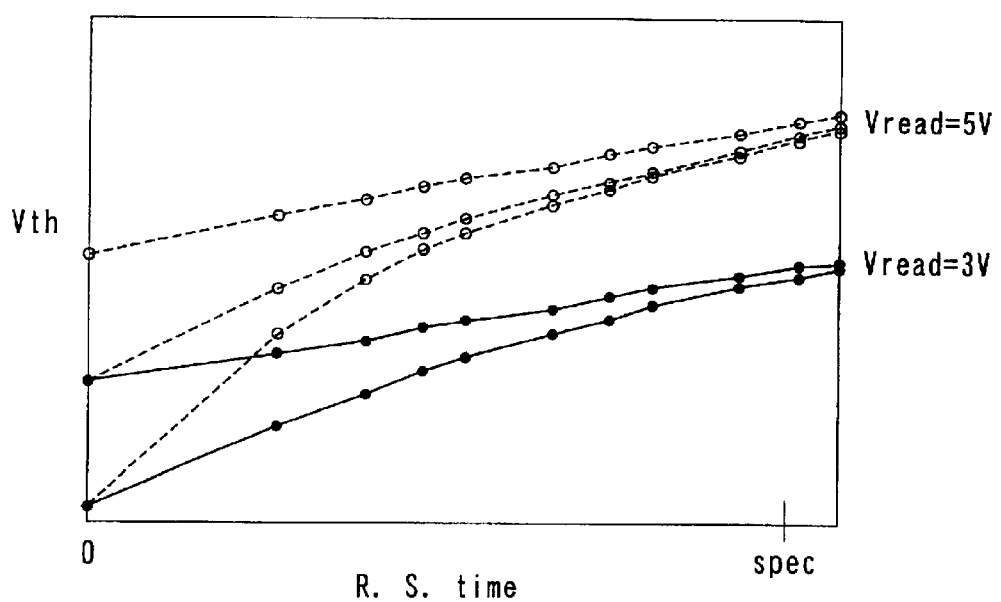
FIG. 2B is a graph showing the read disturb characteristics of a nonvolatile semiconductor memory.

FIG. 2B is a graph showing the read disturb characteristics of the nonvolatile semiconductor memory. Referring to FIG. 2B, the abscissa indicates the read stress time (R.S. TIME), and the ordinate indicates the erased-state threshold voltage Vth. This erased-state threshold voltage Vth is a function of the read stress time.

The threshold voltage after being given the stress for a long time period converges to a predetermined value regardless of the erased-state threshold voltage when the read stress is 0 sec (the erased-state threshold voltage in the initial state). If erasing is deep, a fluctuation in the threshold voltage at the beginning of the stress increases owing to the self-electric-field (an electric field formed by the stored charge) and becomes equivalent to that when erasing is shallow. That is, an erased-state threshold voltage after a certain read stress time (this time is determined by the reliability spec) is a function of the non-selection read voltage Vread. In this case, we have the following equation (7).

$$V_{the}40 \text{ (max)} = F(V_{read}) \qquad (7)$$

The present inventors have found that F(x) can be approximated by a quadratic function, although it depends upon the read disturb characteristic of a memory cell transistor.

Figure 3:
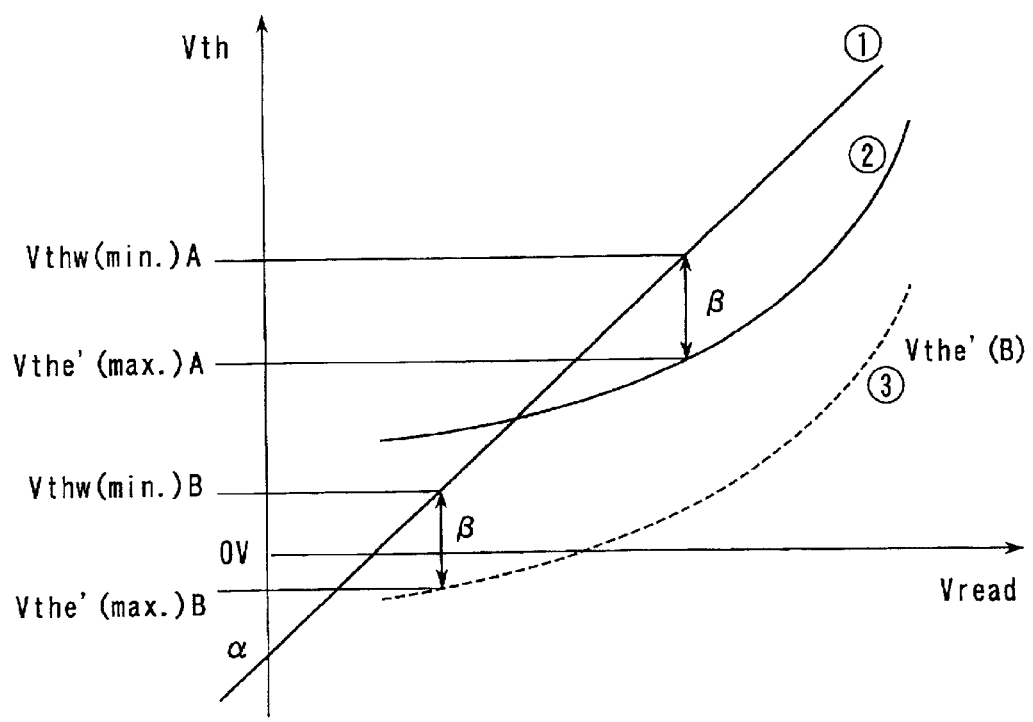
FIG. 3 is a graph showing the relationship between threshold voltages set by taking account of read disturb and Vread in the memory according to the first embodiment.

FIG. 3 is a graph showing the relationship between a threshold voltage set by taking read disturb into consideration, and Vread. Referring to FIG. 3, the abscissa indicates the non-selection read voltage Vread, and the ordinate indicates the threshold voltage Vth of a memory cell. In FIG. 3, ① indicates a curve corresponding to equation (5), and ② and ③ indicate curves corresponding to equation (7). The curve ② and threshold voltages Vthw (min.)A and Vthe'(max.)A indicate a case in which a threshold voltage fluctuation caused by read disturb is large. The curve ③ and threshold voltages Vthw(min.)B and Vthe' (max.)B indicate a case in which the threshold voltage fluctuation caused by read disturb is small.

In this graph shown in FIG. 3, the threshold voltages in the written state and erased state are so set as to satisfy the formula (6). In this case, although the erased-state threshold voltage Vthe' after a sufficiently long read stress becomes larger than the initial erased-state threshold voltage Vthe, the difference between Vthe' and Vthe is desirably not too large, in order to reduce the erasing time and erasing voltage.

The formula (6), i.e., the erased-state threshold voltage Vthe'(max) after a predetermined time depends upon the read disturb characteristic of a memory cell. In case ② in which the threshold voltage fluctuation caused by read disturb is large, the erased-state threshold voltage Vthe' (max) after a predetermined time rises. Compared to case ③ in which this threshold voltage fluctuation is small, therefore, the written-state and erased-state threshold voltages are desirably shifted to higher values in order to improve the reliability.

For a micropatterned memory cell, technologies such as that for a MONOS memory cell are advantageous to increase a coupling ratio γ, decrease a tunnel oxide film thickness $\underline{d}$, and trap electric charge into an insulating film. However, if these technologies are used, the threshold voltage fluctuation caused by read disturb increases as described above.

In addition, in erasing data by direct tunneling of positive electric charge from the whole channel surface in a MONOS memory cell, if the thickness of a tunnel oxide film is decreased to shorten the erasing time, the threshold voltage fluctuation caused by read disturb increases. However, by the application of the first embodiment, a lowering of write and erase windows caused by the threshold voltage fluctuation can be suppressed. This arrangement is effective especially in a case where a tunnel oxide film has a thickness of 3 nm or less.

In the first embodiment, where the memory cell threshold voltages in both the written and erased states are set to be positive, or all the memory cell threshold voltages in the written state and part of the memory cell threshold voltages in the erased state are set to be positive, data destruction of erase data in a repetitive read operation can be prevented reliably, as compared to a conventional NAND EEPROM whose memory cell threshold voltages are set to be positive in the written state and to be negative in the erased state.

Another effect of the first embodiment relates to an erase verify operation. An erase verify operation verifies that the threshold voltage of a memory cell is equal to or smaller than a desired threshold voltage (to be referred to as Vverify hereinafter) after data is erased from that memory cell. In this erase verify operation, Vverify is applied to the control gate electrode to check whether the memory cell transistor is turned on.

In a conventional NAND EEPROM, the erased-state threshold voltage is 0 V or less. Therefore, Vverify must be smaller than 0 V when a margin is taken into consideration. If Vverify is negative, an extra data control line driver for applying a negative voltage to the control gate electrode is necessary, and this increases the peripheral circuit area. If no negative voltage is to be applied to the gate, the source voltage must be raised when an erase verify operation is performed. This also requires an extra circuit for applying a positive voltage to the source line, resulting in an increased peripheral circuit area.

In contrast, in this first embodiment, Vverify is positive because the erased-state threshold voltage is positive, so the potential of the source line when an erase verify operation is performed can be 0 V which is the same reference voltage as in a normal read operation. In addition, since a positive voltage can also be applied to the control gate electrode, the peripheral circuit portion does not require any extra circuit for an erase verify operation. This simplifies the peripheral circuit portion and reduces the circuit area.

Figure 4A:
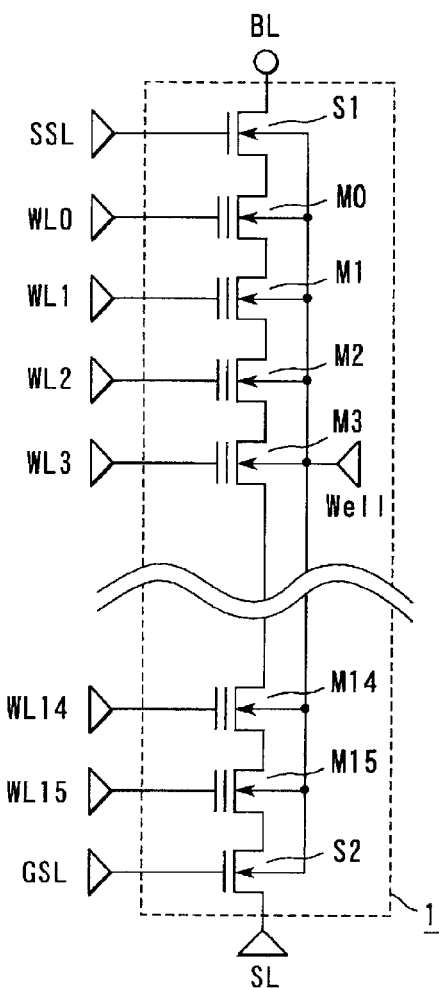
FIGS. 4A and 4B are an equivalent circuit diagram and a plan view, respectively, showing memory cells of the NAND EEPROM according to the first embodiment of the present invention.
Figure 4B:
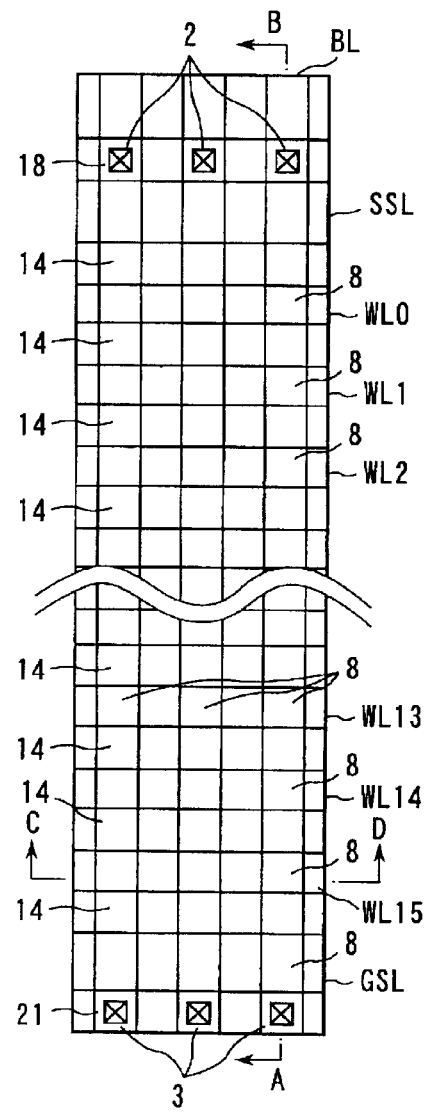

FIGS. 4A and 4B are an equivalent circuit diagram and a plan view, respectively, showing memory cells in a NAND EEPROM according to the first embodiment of the present invention.

As shown in FIG. 4A, memory cells M0 to M15 each composed of a transistor having a charge storage layer are connected in series. One terminal of each memory cell is connected to a data transfer line BL via a selection transistor S1. The other terminal of each memory cell is connected to a common source line SL via a selection transistor S2. The control electrodes of these memory cells M0 to M15 are connected to data select lines WL0 to WL15, respectively. A common well potential Well is applied to the memory cells M0 to M15.

To select one of a plurality of memory cell blocks along the data transfer lines WL0 to WL15 and connect the selected memory cell block to the data transfer line, the control electrode of the selection transistor S1 is connected to a block select line SSL. The control electrode of the selection transistor S2 is connected to a block select line GSL. With this configuration, a so-called NAND memory cell block 1 is formed.

FIG. 4B shows a structure in which three such memory cell blocks 1 shown in FIG. 4A are juxtaposed. For a better understanding of the cell structure, FIG. 4B illustrates only a structure below the control gate electrode.

As shown in FIG. 4B, the block select lines SSL and GSL of the selection gates are connected between cells adjacent in the lateral direction of the paper surface by a conductor in the same layer as the charge storage layer of the control lines WL0 to WL15 of the memory cell elements. This memory cell block 1 need only have at least one each of the block select lines SSL and GSL. To increase the density, these block select lines SSL and GSL are preferably formed in the same direction as the data select lines WL0 to WL15.

Referring to FIG. 4B, three data transfer lines BL run in the longitudinal direction of the paper surface, which is a direction perpendicular to the data select lines WL0 to WL15. A bit line contact 2 is formed in that portion of each data transfer line BL, which is near the block select line SSL. Also, a source line contact 3 is formed in that portion of each data transfer line BL, which is close to the block select line GSL. Thus forming the data select lines regulates the line/space patterns of the control gate electrodes and facilitates processing.

Figure 16:
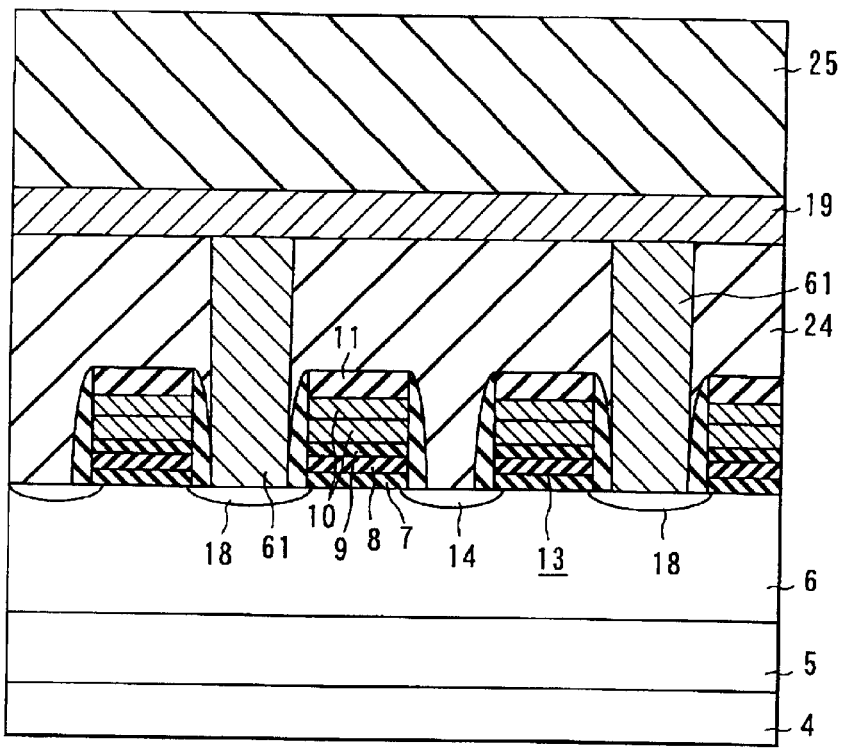
FIG. 16 is a sectional view taken along the line A-B in FIG. 14B, in which a memory cell is a MONOS type memory cell.

In FIG. 4A, 16, i.e., $2^4$ memory cell transistors are connected to the memory cell block 1. However, it is only necessary to connect a plurality of memory cells to the data transfer lines and data select lines. Therefore, it is desirable to connect 32 or $2^N$ (N is a positive integer) memory cell transistors in order to perform address decoding.

To store data, a high voltage of, e.g., 10 to 25 V is applied between the control gate electrode and the semiconductor substrate. Consequently, electric charge is moved via a tunnel insulating film to change the charge amount in an insulating film serving as a charge storage layer or in a conducting film serving as a floating gate layer. When the charge amount in the charge storage layer changes, the threshold voltage of a memory cell transistor also changes, and data can be read out by detecting this change.

To erase data, a high voltage (e.g., 8 to 25 V) is applied to the semiconductor substrate, with the control gate electrode set at, e.g., 0 V, thereby releasing negative charge from the charge storage layer to the semiconductor substrate, or thereby injecting positive charge into the charge storage layer from the semiconductor substrate. Alternatively, data is erased by biasing the source or drain, or the source/drains positively with respect to the well, and biasing the control gate electrode negatively with respect to the well, to inject hot holes into the charge storage layer.

Figure 5A:
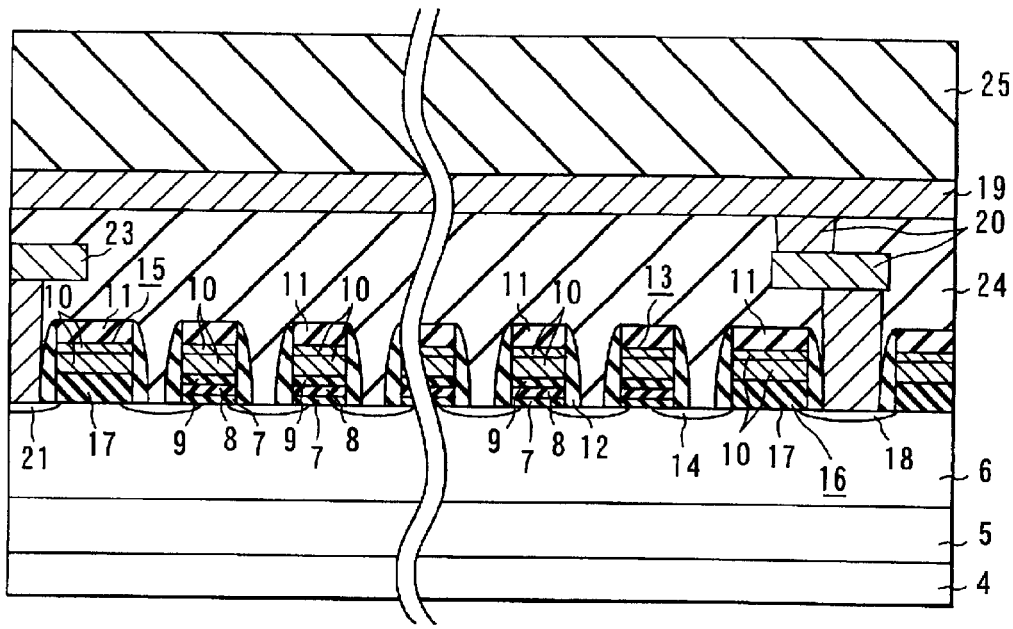
FIGS. 5A and 5B are sectional views taken along lines A-B and C-D, respectively, in FIG. 4B.
Figure 5B:
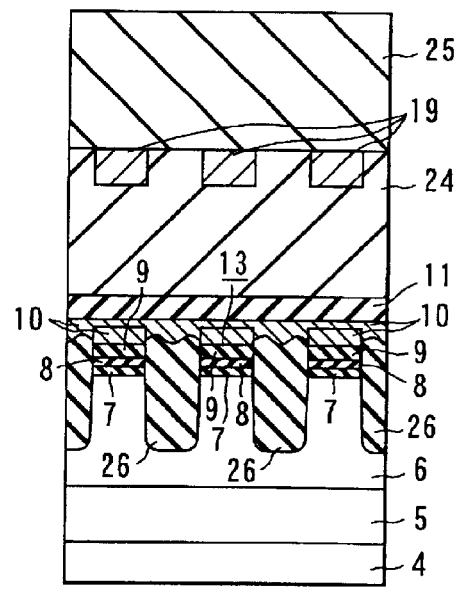

FIGS. 5A and 5B are sectional views taken along a line A-B (column direction) and a line C-D (row direction) in FIG. 4B.

As shown in FIG. 5A, the memory cell transistor of this embodiment is a MONOS transistor which uses an insulating film such as a silicon nitride film as a charge storage layer. An n-well 5 is formed on a p-semiconductor substrate 4. A p-well 6 is formed on this n-well 5. This p-well 6 is so formed that the impurity concentration of boron is, e.g., $10^{14}$ to $10^{19}$ cm$^{-3}$. On the p-well 6, a charge storage layer 8 is formed via a tunnel gate insulating film 7. This tunnel gate insulating film 7 is, e.g., a 1- to 10-nm thick silicon oxide film or oxynitride film. The charge storage layer 8 is, e.g., a 3- to 50-nm thick SiN or SiON layer.

On this charge storage layer 8, control gate electrodes 10 are formed via a block insulating film 9. This block insulating film 9 is, e.g., a 2- to 10-nm thick silicon oxide film. The control gate electrode 10 has a thickness of, e.g., 10 to 500 nm and is made of polysilicon or has a stacked structure of WSi (tungsten silicide) and polysilicon, a stacked structure of NiSi, MoSi, TiSi, or CoSi and polysilicon, a stacked structure of metal and polysilicon, or a single-layered structure of metal, polysilicon, WSi, NiSi, MoSi, TiSi, or CoSi.

A gate cap insulating film 11 is formed on the control gate electrodes 10. The side surfaces of the stacked structure of the gate cap insulating film 11, the control gate electrode 10, the block insulating film 9, the charge storage layer 8, and the tunnel insulating film 7 are covered with a gate side wall insulating film 12. This gate side wall insulating film 12 is, e.g., a 5- to 200-nm thick silicon nitride film or silicon oxide film. In this manner, memory cell gates 13 are formed.

The control gate electrodes 10 are formed to block boundaries in the lateral direction of the paper surface so as to be connected between the memory cell blocks adjacent in FIG. 4B, thereby forming the data select lines WL0 to WL15 and the selection gate control lines SSL and GSL. Note that a voltage is desirably applicable to the p-well 6 by the n-well 5 independently of the p-semiconductor substrate 4, in order to reduce the booster circuit load during erasing and suppress the power consumption.

On the two sides of each memory cell gate 13, source/drain n-diffusion layers 14 are formed with the gate side wall insulating film 12 sandwiched between them. The source/drain n-diffusion layers 14, the charge storage layer 8, and the control gate electrode 10 form a MONOS nonvolatile EEPROM cell. The gate length of the charge storage layer is set to 0.01 to 0.5 μm. The source/drain n-diffusion layers 14 are formed to have a depth of 10 to 500 nm, such that the surface impurity concentration of, e.g., phosphorus, arsenic, or antimony is $10^{17}$ to $10^{21}$ cm$^{-3}$. Furthermore, the source/drain n-diffusion layers 14 are connected in series between memory cells to realize NAND connections.

As shown in FIG. 5A, a gate electrode 15 is connected to a block select line corresponding to the selection gate control line GSL, and a gate electrode 16 is connected to a block select line corresponding to the selection gate control line SSL. Each of these gate electrodes 15 and 16 is formed by the same layer as the control electrode 10 of the memory cell gate 13 of the memory cell transistor. The gate electrodes 15 and 16 oppose the p-well 6 via a gate insulating film 17 to form MOS transistors. The gate insulating film 17 is, e.g., a 3- to 15-nm thick silicon oxide film or oxynitride film. The gate length of the gate electrodes 15 and 16 is larger than the gate length of the memory cell gate 13, e.g., 0.02 to 1 μm. This makes it possible to ensure a high ON/OFF ratio of block selection to non-block selection, and prevent write and read errors.

An n-diffusion layer 18 formed on one side of the gate electrode 16 to serve as a source or drain electrode is connected to a data transfer line 19 via a contact 20. This data transfer line 19 is made of tungsten, tungsten silicide, titanium, titanium nitride, or aluminum. The data transfer line 19 (BL) is formed to memory cell block boundaries in the longitudinal direction of the paper surface of FIG. 4B, so as to be connected between adjacent memory cell blocks.

A source/drain n-diffusion layer 21 formed on one side of the gate electrode 15 is connected to a source line 23 (SL) via a contact 22. This source line 23 (SL) is formed to block boundaries in the lateral direction of the paper surface of FIG. 4B, so as to be connected between adjacent memory cell blocks. The contacts 20 and 22 are filled with, e.g., n- or p-doped polysilicon, tungsten, tungsten silicide, Al, TiN, or Ti, and function as conductor regions.

A portion between the source line 23, the data transfer line 19, and the p-well 6 is filled with an interlayer 24 made of, e.g., $SiO_2$ or SiN. On the data transfer line 19, an insulating film protective layer 25 made of, e.g., SiO$_2$, SiN, or polyimide is formed. On this protective layer 25, an upper interconnection (not shown) made of, e.g., W, Al, or Cu is formed as needed.

In the section shown in FIG. 5B, the individual memory cell gates 13 are isolated and insulated by element isolation regions 26. An interlayer 24 is formed immediately above each memory cell gate 13, and the data transfer lines 19 are formed.

Since MONOS cells are used in this embodiment, the write voltage and erase voltage can be lowered compared to those used in a floating gate type EEPROM. Accordingly, a prescribed withstand voltage can be maintained even when the element isolation interval is narrowed to decrease the thickness of the gate insulating film. This can decrease the area of a circuit to which a high voltage is applied, and further reduce the chip area. Also, compared to a floating gate type memory cell, the thickness of the charge storage layer 8 can be decreased to 20 nm or less, so the aspect ratio in gate formation can be decreased. Additionally, it is possible to improve the processed shape of the gate electrode, improve the quality of the interlayer 24 buried between the gates, and improve the withstand voltage.

Furthermore, since neither a floating gate formation process nor a slit formation process is necessary, the process steps can be further reduced. Also, the charge storage layer 8 is an insulator, so electric charge is captured in each individual charge trap. Therefore, electric charge is not easily extracted by radiation, and this gives the device a high resistance. In addition, even when the thickness of the side wall insulating film 12 of the charge storage layer 8 is decreased, electric charge captured in this charge storage layer 8 is not entirely extracted. As a consequence, a good retention characteristic can be maintained.

The first embodiment can achieve high integration in a NAND memory, and enables a random access operation in a NOR memory. Furthermore, the first embodiment can achieve high integration in an AND memory, and enables a low-voltage operation in a MONOS memory using an insulating film as a charge storage layer. On the other hand, the data retention characteristic of a floating gate type memory using a conducting film as a charge storage layer is better than that of a MONOS memory. This first embodiment improves read disturb and thus is more effective in NAND and MONOS memories in which data destruction due to read disturb is more serious.

First Modification of First Embodiment

Figure 6A:
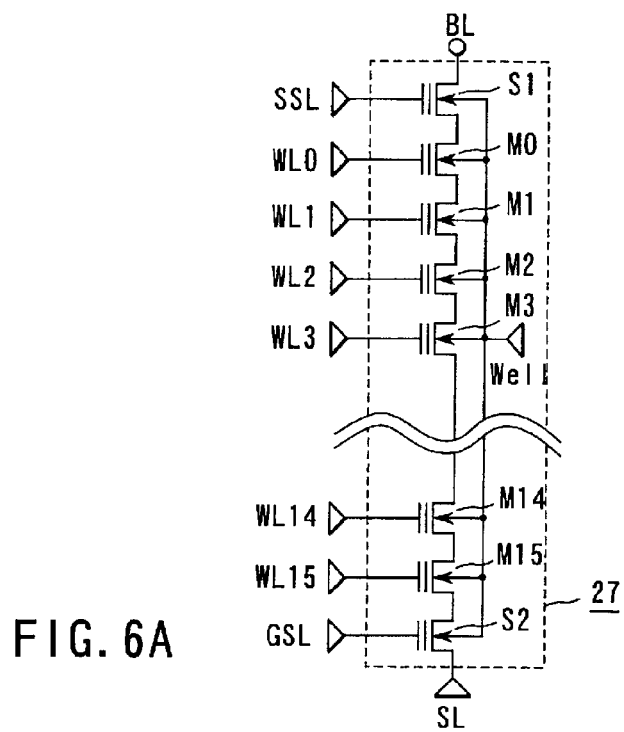
FIG. 6A is an equivalent circuit diagram showing a memory cell block using MONOS cells according to the first modification of the first embodiment.
Figure 6B:
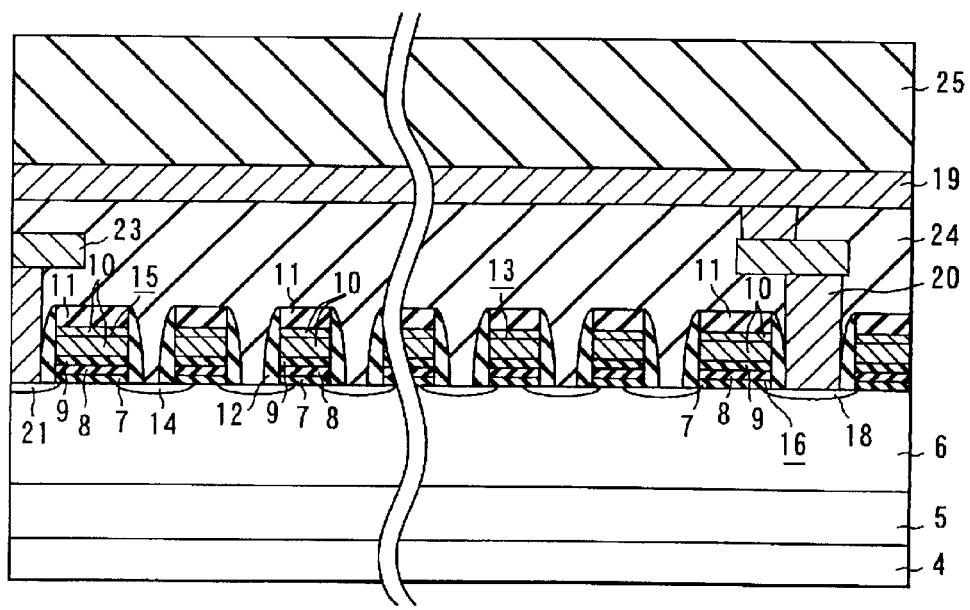
FIG. 6B is a sectional view of the modification shown in FIG. 6A, taken along the line A-B in FIG. 4B.

FIG. 6A is an equivalent circuit diagram showing a memory cell block 27 using a MONOS cell according to the first modification of the first embodiment. This modification is the same as the first embodiment illustrated in the equivalent circuit diagram of FIG. 4A except that selection transistors S1 and S2 are not MOS cells but MONOS transistors. A plan view of this modification is the same as shown in FIG. 4B. FIG. 6B is a sectional view of this modification taken along the line A-B in FIG. 4B. A sectional view of this modification taken along the line C-D in FIG. 4B is the same as shown in FIG. 5B.

As shown in FIG. 6B, a selection transistor has the same MONOS structure as a memory cell. Since the steps of separately forming selection transistors and memory cell transistors can be omitted, the fabrication cost can be reduced. In addition, no margin for separate formation is necessary, so the distance between selection transistors and memory cells can be decreased. This can reduce the device area. If these transistors are to be separately formed, lithography is necessary for the formation, so a mask alignment margin must be taken. If no such separate formation is to be performed, no alignment margin is necessary, so the degree of micropatterning can be increased accordingly.

Second Modification of First Embodiment

Figure 7A:
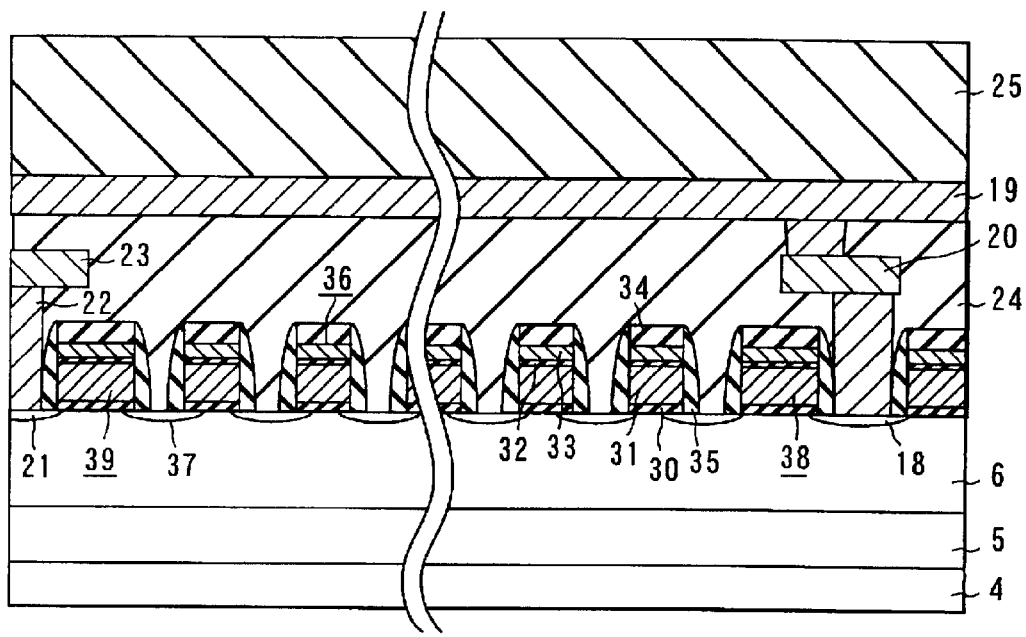
FIGS. 7A and 7B are sectional views of the second modification of the first embodiment, taken along the lines A-B and C-D, respectively, in FIG. 4B.
Figure 7B:
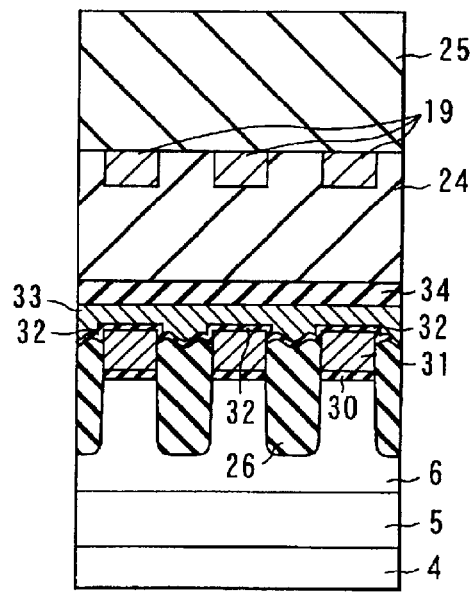

This modification relates to a device having a floating gate type memory structure using a conductor such as impurity-doped polysilicon as a charge storage layer. An equivalent circuit of this modification is as shown in FIG. 4A or 6A, and its plan view is as shown in FIG. 4B. FIGS. 7A and 7B are sectional views of this modification taken along the lines A-B and C-D, respectively, in FIG. 4B.

As shown in FIG. 7A, an n-well 5 is formed on a p-semiconductor substrate 4. On this n-well 5, a p-well 6 is formed such that the impurity concentration of, e.g., boron is $10^{14}$ to $10^{19}$ cm$^{-3}$. On this p-well 6, a charge storage layer 31 is formed via a tunnel gate insulating film 30. This tunnel gate insulating film 30 is, e.g., a 3- to 15-nm thick silicon oxide film or oxynitride film. The charge storage layer 31 is, e.g., a 10- to 500-nm thick polysilicon layer doped with $10^{18}$ to $10^{21}$ cm$^{-3}$ of phosphorus or arsenic.

As shown in FIG. 7B, the charge storage layer 31 and the like are formed to be self-aligned with the p-well 6 on a region where an element isolation insulating film 26 made of a silicon oxide film is not formed. To form this structure, the tunnel gate insulating film 30 and the charge storage layer 31 are first entirely deposited on the p-well 6. These layers are then etched to a depth of, e.g., 0.05 to 0.5 μm of the p-well 6 by patterning, thereby forming trenches. An insulating film is buried in these trenches to form an element isolation insulating film 26.

In this method, the tunnel gate insulating film 30 and the charge storage layer 31 can be formed on an entire flat surface with no steps. Therefore, film formation having uniform characteristics can be performed with improved uniformity. As described above, it is preferable to use the process by which gate electrodes are formed before element isolation regions. If the tunnel gate insulating film 30 and the charge storage layer 31 are formed after element isolation regions are formed, uniform film formation is difficult owing to steps in these element isolation regions.

On the charge storage layer 31, control gate electrodes 33 are formed via an inter-poly-Si insulating film 32. This inter-poly-Si insulating film 32 is, e.g., a 5- to 30-nm thick silicon oxide film, oxynitride film, or silicon oxide film/silicon nitride film/silicon oxide film. The control gate electrode 33 has a thickness of, e.g., 10 to 500 nm and is made of polysilicon doped with $10^{17}$ to $10^{21}$ cm$^{-3}$ of phosphorus, arsenic, or boron or has a stacked structure of WSi (tungsten silicide) and polysilicon, a stacked structure of NiSi, MoSi, TiSi, or CoSi and polysilicon, a stacked structure of metal and polysilicon, or a single-layered structure of metal, polysilicon, WSi, NiSi, MoSi, TiSi, or CoSi.

The control gate electrodes 33 are formed to block boundaries in the lateral direction of the paper surface in FIG. 4B, so as to be connected between the memory cell blocks adjacent in FIG. 4A, thereby forming data select lines WL0 to WL15. Note that a voltage is desirably applicable to the p-well 6 by the n-well 5 independently of the p-semiconductor substrate 4, in order to reduce the step-up circuit load during erasing and suppress the power consumption. A gate cap insulating film 34 is formed on the control gate electrodes 33.

The side surfaces of the gate cap insulating film 34, the control gate electrode 33, the inter-poly-Si insulating film 9, the charge storage layer 31, and the tunnel gate insulating film 30 are covered with a gate side wall insulating film 35. This gate side wall insulating film 35 is, e.g., a 5- to 200-nm thick silicon nitride film or silicon oxide film. In this manner, memory cell gates 36 are formed.

As shown in FIG. 7A, on the two sides of each memory cell gate 36, source/drain n-diffusion layers 37 are formed with the gate side wall insulating film 35 sandwiched between them. The source/drain n-diffusion layers 37 and the memory cell gate 36 form a floating gate type EEPROM in which the charge amount stored in the charge storage layer 31 is the information amount. The gate length of the charge storage layer 31 is set to 0.01 to 0.5 μm.

The source/drain n-diffusion layers 37 are formed to have a depth of 10 to 500 nm, such that the surface impurity concentration of, e.g., phosphorus, arsenic, or antimony is $10^{17}$ to $10^{21}$ cm$^{-3}$. The source/drain n-diffusion layers 37 are shared by adjacent memory cells to realize NAND connections.

Referring to FIG. 7A, a gate electrode 38 is connected to a selection gate control line SSL (FIG. 4B), and a gate electrode 39 is connected to a selection gate control line GSL (FIG. 4B). These gate electrodes are formed by the same layer as the memory cell gate 36 of the floating gate type EEPROM. The gate length of the gate electrodes 38 and 39 is set to be larger than the gate length of the memory cell gate 36, e.g., 0.02 to 1 μm. This makes it possible to ensure a high ON/OFF ratio of block selection to non-block selection, and prevent write and read errors.

A source/drain n-diffusion layer 18 formed on one side of the gate electrode 38 is connected to a data transfer line 19 via a contact 20. This data transfer line 19 is made of tungsten, tungsten silicide, titanium, titanium nitride, or aluminum. The data transfer line 19 is formed to block boundaries in the longitudinal direction of the paper surface of FIG. 4B, so as to be connected between adjacent memory cell blocks.

A source/drain n-diffusion layer 21 formed on one side of the gate electrode 39 is connected to a source line 23 via a contact 22. This source line 23 is formed to block boundaries in the lateral direction of the paper surface of FIG. 4B, so as to be connected between adjacent memory cell blocks. The contacts 20 and 22 are filled with, e.g., n- or p-doped polysilicon, tungsten, tungsten silicide, Al, TiN, or Ti, and function as conductor regions.

A portion between the data transfer line 19 and the p-well 6 is filled with an interlayer 24 made of, e.g., SiO$_2$ or SiN. On the data transfer line 19, an insulating film protective layer 25 made of, e.g., SiO$_2$, SiN, or polyimide is formed. On this protective layer 25, an upper interconnection (not shown) made of, e.g., W, Al, or Cu is formed as needed.

In this modification, both the threshold voltages in written and erased states as data storage states of a memory cell are positive. Alternatively, the threshold voltages of all memory cells in the written state and the threshold voltages of some memory cells in the erased state are positive. Accordingly, it is possible to improve a lowering of the threshold voltage window caused by read disturb by which the threshold voltage of a memory cell in the erased state rises owing to a repetitive read operation. Furthermore, since the erased-state threshold voltage is positive, no negative voltage needs to be used during an erase verify operation. This can simplify a peripheral circuit.

Second Embodiment

Figure 8A:
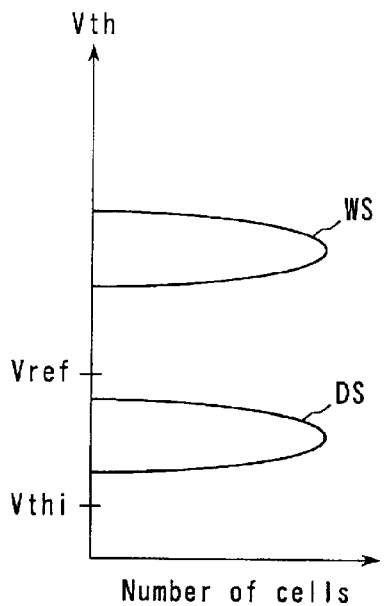
FIG. 8A is a graph showing an example of threshold voltage distributions corresponding to data storage states (an erased state and written state) in a memory according to the second embodiment of the present invention.

FIG. 8A is a graph showing an example of threshold voltage distributions corresponding to data storage states (an erased state DS and a written state WS) in a device according to the second embodiment of the present invention. Referring to FIG. 8A, the abscissa indicates the number of memory cell transistors, and the ordinate indicates the magnitude of the threshold voltage.

FIG. 8A is characterized in that negative electric charge (electrons) is stored in a charge storage layer in both the written state and erased state of a memory cell. In other words, threshold voltages in both the written state and erased state are higher than a neutral threshold voltage (the threshold voltage of a memory cell when a charge storage layer has no electric charge) Vthi. As shown in FIG. 8A, in the written state WS, all the threshold voltages of the memory cells are distributed at values larger than a read voltage Vref. In the erased state DS, all the threshold voltages of the memory cells are distributed at values smaller than the read voltage Vref and larger than the neutral threshold voltage Vthi.

Figure 8B:
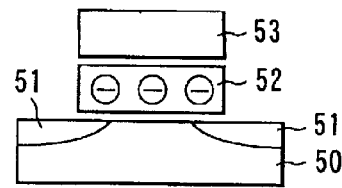
FIGS. 8B and 8C are schematic views showing the written state and erased state, respectively, which correspond to the distributions shown in FIG. 8A, of a memory cell.
Figure 8C:
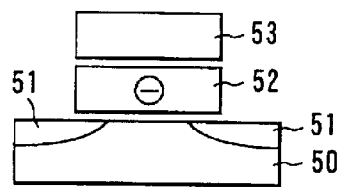

FIGS. 8B and 8C are schematic views showing the written state and erased state, respectively, of a memory cell, which correspond to the distribution shown in FIG. 8A.

As shown in FIGS. 8B and 8C, source/drain diffusion layers 51 are formed in a semiconductor substrate 50. A charge storage layer 52 is formed on that portion of the semiconductor substrate 50, which is sandwiched between the source/drain diffusion layers 51. A control gate electrode 53 is formed on top of this charge storage layer 52. In the written state shown in FIG. 8B, a large amount of negative charge is stored in the charge storage layer 52. In the erased state shown in FIG. 8C, a smaller amount of negative charge than in the written state is stored in the charge storage layer 52.

Figure 9A:
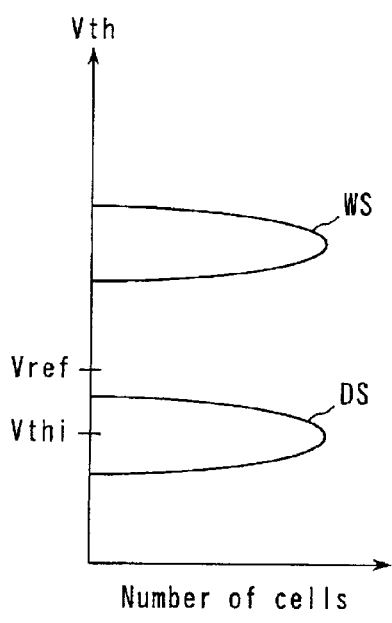
FIG. 9A is a graph showing another example of threshold voltage distributions corresponding to the data storage states (the erased state and written state) in the memory according to the second embodiment.

FIG. 9A is a graph showing another example of threshold voltage distributions corresponding to the data storage states (the erased state DS and the written state WS) in the device according to the second embodiment. The abscissa indicates the number of memory cell transistors, and the ordinate indicates the magnitude of the threshold voltage.

The characteristic feature of FIG. 9A is that in the erased state DS, the threshold voltages of the memory cells are distributed across the neutral threshold voltage Vthi. That is, the neutral threshold voltage is present within the range of the threshold voltage distribution in the erased state DS. In the written state WS, on the other hand, all the threshold voltages of the memory cells are distributed at values larger than the read voltage Vref.

Figure 9B:
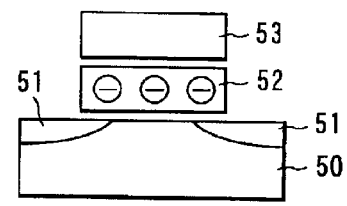
FIG. 9B and FIGS. 9C and 9D are schematic views showing the written state and erased state, respectively, which correspond to the distributions shown in FIG. 9A, of a memory cell.
Figure 9C:
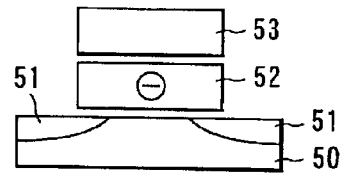
Figure 9D:
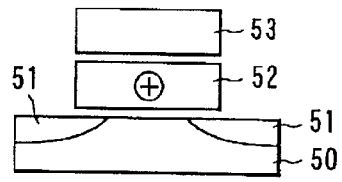

FIGS. 9B, 9C, and 9D are schematic views showing the written state (FIG. 9B) and the erased state (FIGS. 9C and 9D) of a memory cell, which correspond to the distribution shown in FIG. 9A.

In the written state shown in FIG. 9B, a large amount of negative charge is stored in the charge storage layer 52. In the erased state of some memory cells shown in FIG. 9C, a smaller amount of negative charge than in the written state is stored in the charge storage layer 52. In this case, the threshold voltage of each memory cell is higher than the neutral threshold voltage Vthi. In the erased state of some other memory cells shown in FIG. 9D, a small amount of positive charge is stored. In this case, the threshold voltage of each memory cell is lower than the neutral threshold voltage Vthi.

An erase operation is performed by, e.g., applying a high voltage (e.g., 8 to 25 V) to the semiconductor substrate, with the control gate electrode set at 0 V, thereby releasing negative charge from the charge storage layer to the semiconductor substrate, or thereby injecting positive charge into the charge storage layer from the semiconductor substrate. Alternatively, data is erased by biasing the source or drain, or the source/drains positively with respect to the well, and biasing the control gate electrode negatively with respect to the well, to inject hot holes into the charge storage layer.

A write operation is performed by, e.g., applying a high voltage 10 to 25 V to the control gate electrode while the semiconductor substrate is set at 0 V, thereby injecting negative charge from the semiconductor substrate into the charge storage layer. Alternatively, a write operation is performed by positively biasing the drain potential with respect to the source potential to generate hot electrons accelerated by the channel, and positively biasing the gate electrode with respect to the source potential to inject these hot electrons into the charge storage layer.

FIG. 10A is a circuit diagram showing a NAND EEPROM as a semiconductor memory according to the second embodiment of the present invention. The configuration of a memory cell block 1 is the same as shown in FIG. 4A except potential applied states.

In this memory shown in FIG. 10A, a read operation performed under the control of a driver/controller DRC is as follows. That is, a bit line BL is set to float after being precharged, and a source line Source is set at 0 V. In this state, the voltage of the control gate electrode of a memory cell (transistor) M2 selected for data read is set at the read voltage Vref, the voltages of the control gate electrodes of other memory cells M0, M1, and M3 to M15 are set at a non-selection read voltage Vread, and the gate voltages of first and second selection transistors S1 and S2 are set at the read voltage Vref. Data is read by checking, by the bit line BL, whether an electric current flows through the memory cell M2 selected for data read.

If a threshold voltage Vth of this memory cell M2 selected for data read is larger than the read voltage Vref, the memory cell M2 is turned off, so the bit line BL maintains the precharge voltage. If the threshold voltage Vth of the memory cell M2 selected for data read is smaller than the read voltage Vref, the memory cell M2 is turned on, so the potential of the bit line BL lowers from the precharge potential by $\Delta V$. Data in the memory cell M2 is read out by sensing this potential change by a sense amplifier SEA in a data circuit CID connected to the bit line.

The read voltage Vref is intermediate between the threshold voltage in the written state and that in the erased state. The non-selection read voltage Vread is higher than the threshold voltage in the written state. The power supply voltage Vcc is higher than the threshold voltage of the selection transistor.

FIG. 10B is a circuit diagram showing an AND EEPROM as another semiconductor memory according to the second embodiment of the present invention.

This memory cell block has a first selection transistor S1 having a terminal connected to a bit line BL, and a second selection transistor S2 having a terminal connected to a source line Source. Between these selection transistors S1 and S2, a plurality of memory cell transistors M0 to M15 are connected in parallel to form a memory cell block 55.

A read operation performed under the control of a driver/ controller DRC in the memory shown in FIG. 10B is as follows. That is, the bit line BL is set to float after being precharged, and the source line Source is set at 0 V. In this state, the voltage of the control gate electrode of the memory cell (transistor) M2 selected for data read is set at a read voltage Vref, the voltages of the control gate electrodes of the other memory cells M0, M1, and M3 to M15 are set at a non-selection read voltage Vread, and the gate voltages of the first and second selection transistors S1 and S2 are set at a power supply voltage Vcc. Data is read by checking, by the bit line BL, whether an electric current flows through the memory cell M2 selected for data read.

If a threshold voltage Vth of this memory cell M2 selected for data read is larger than the read voltage Vref, the memory cell M2 is turned off, so the bit line BL maintains the precharge voltage. If the threshold voltage Vth of the memory cell M2 selected for data read is smaller than the read voltage Vref, the memory cell M2 is turned on, so the potential of the bit line BL lowers from the precharge potential by $\Delta V$. Data in the memory cell M2 is read out by sensing this potential change by a sense amplifier SEA in a data circuit CID connected to the bit line.

The read voltage Vref is intermediate between the threshold voltage in the written state and that in the erased state. The non-selection read voltage Vread is lower than the threshold voltage in the written state. The power supply voltage Vcc is higher than the threshold voltage of the selection transistor.

FIG. 10C is a circuit diagram showing a NOR EEPROM as still another semiconductor memory according to the second embodiment of the present invention.

In this NOR EEPROM, one terminal of a memory cell transistor M1 is connected to a bit line BL1, and one terminal of another memory cell transistor M2 is connected to the other terminal of the memory cell transistor M1. The other terminal of the memory cell transistor M2 is connected to the bit line BL1 and to one terminal of still another memory cell transistor M3. In this way, these memory cell transistors M1 to M3 form a memory cell block 56. In addition, a second bit line BL2 runs parallel to the first bit line BL1. Similar to the first bit line BL1, a plurality of memory cell transistors M4 to M6 are connected to the second bit line BL2.

A read operation performed under the control of a driver/ controller DRC in the memory shown in FIG. 10C is as follows. That is, the bit line BL is set to float after being precharged, and the voltage of a source line is set at Vsl. In this state, the voltage of the control gate electrode of the memory cell (transistor) M2 selected for data read is set at a read voltage Vref, and the voltages of the control gate electrodes of the other memory cells are set at a non-selection read voltage Vread. Data is read by checking, by the bit line BL, whether an electric current flows through the memory cell M2 selected for data read.

If a threshold voltage Vth of this memory cell M2 selected for data read is larger than the read voltage Vref, the memory cell M2 is turned off, so the bit line BL maintains the precharge voltage. If the threshold voltage Vth of the memory cell M2 selected for data read is smaller than the read voltage Vref, the memory cell M2 is turned on, so the potential of the bit line BL lowers from the precharge potential by $\Delta V$. Data in the memory cell M2 is read out by sensing this potential change by a sense amplifier SEA in a data circuit CID connected to the bit line.

The read voltage Vref is intermediate between the threshold voltage in the written state and that in the erased state. The non-selection read voltage Vread is lower than the threshold voltage in the written state. The source line voltage Vsl is normally 0 V.

In the equivalent circuit diagrams shown in FIGS. 10A and 10B, the selection transistor has a structure different from that of the memory cell. However, this selection transistor can also have a nonvolatile semiconductor memory structure having a charge storage layer, similar to that of the memory cell. Also, as the structure of the memory cell, a floating gate type memory cell or a MONOS memory cell is applicable.

Figure 11A:
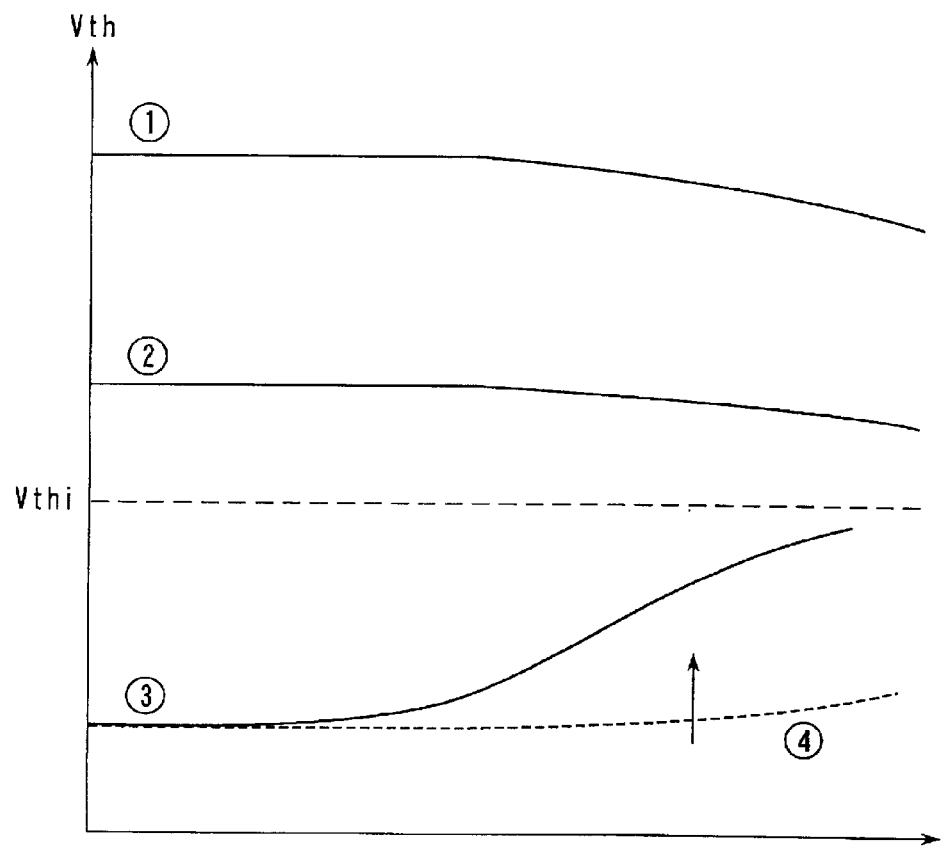
FIG. 11A is a graph showing the data retention characteristics of a memory cell in a nonvolatile semiconductor memory according to the second embodiment.
Figure 11B:
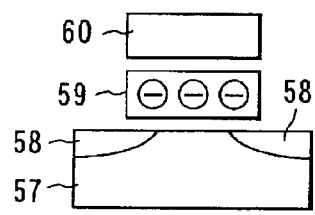
FIGS. 11B, 11C, and 11D are schematic views showing data storage states, which correspond to the characteristics shown in FIG. 11A, of a memory cell.
Figure 11C:
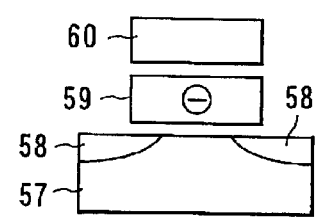
Figure 11D:
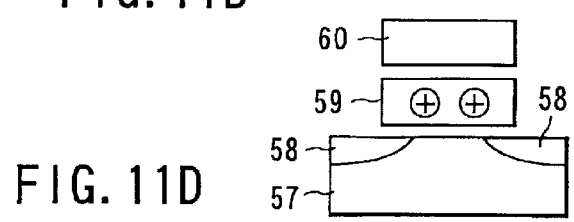

FIG. 11A is a graph showing the data retention characteristics of a memory cell of a nonvolatile semiconductor memory according to the second embodiment. FIGS. 11B, 11C, and 11D are schematic views showing those data storage states of the memory cell, which correspond to the characteristics shown in FIG. 11A.

As shown in FIGS. 11B, 11C, and 11D, this memory cell has a pair of source/drain diffusion layers 58 formed in a semiconductor substrate 57. A charge storage layer 59 and a control gate electrode 60 are formed on the semiconductor substrate 57.

Referring to FIG. 11A, the abscissa indicates the data retention time, and the ordinate indicates a threshold voltage Vth. In FIG. 11A, solid lines ①, ②, and ③ correspond to the states shown in FIGS. 11B, 11C, and 11D, respectively. That is, solid line ① indicates the characteristic when a large amount of negative charge is stored in the charge storage layer 59 (FIG. 11B). Solid line ② indicates the characteristic when a small amount of negative charge is stored in the charge storage layer 59 (FIG. 11C). Solid line ③ indicates the characteristic when a large amount of positive charge is stored in the charge storage layer 59 (FIG. 11D). Additionally, broken line ④ in FIG. 11A indicates the state shown in FIG. 11D before repetitive programming is performed.

Electric charge stored in the charge storage layer leaks over a long time period and finally becomes zero, i.e., converges to a neutral threshold voltage Vthi. The present inventors have found that a charge storage layer of a nonvolatile semiconductor memory has different charge retention characteristics for negative carriers (electrons) and positive carriers (holes). This difference is particularly significant in data retention after write and erase are repeatedly performed; the hole retention characteristic is inferior to the electron retention characteristic. In FIG. 11A, this is expressed as follows. The states of solid lines ① and ② in which negative carriers are stored do not largely change with the retention time. In contrast, the state of solid line ③ in which positive charge is stored abruptly approaches to Vthi with the passing of the retention time. It has also been found that this phenomenon is more remarkable in memory cells having a charge storage layer formed of an insulating film.

Accordingly, in a conventional method in which electrons are stored during writing and holes are stored during erasing, the life of a device is determined by a threshold voltage fluctuation in the hole stored state inferior in charge retention capability. In contrast, the second embodiment can improve the data retention characteristic because negative charge is stored even in the erased state.

Next, effects when this second embodiment is applied to a MONOS memory cell will be described. That is, a case in which a tunnel oxide film is 4 nm or less and direct tunneling of holes on the entire channel surface is used in erasing will be explained below. If the thickness of a tunnel oxide film is about 5 to 6 nm, an erase operation is performed using hot holes. Note that the insulating film thickness can be measured using, e.g., a TEM (Transmission Electron Microscope).

Figure 12A:
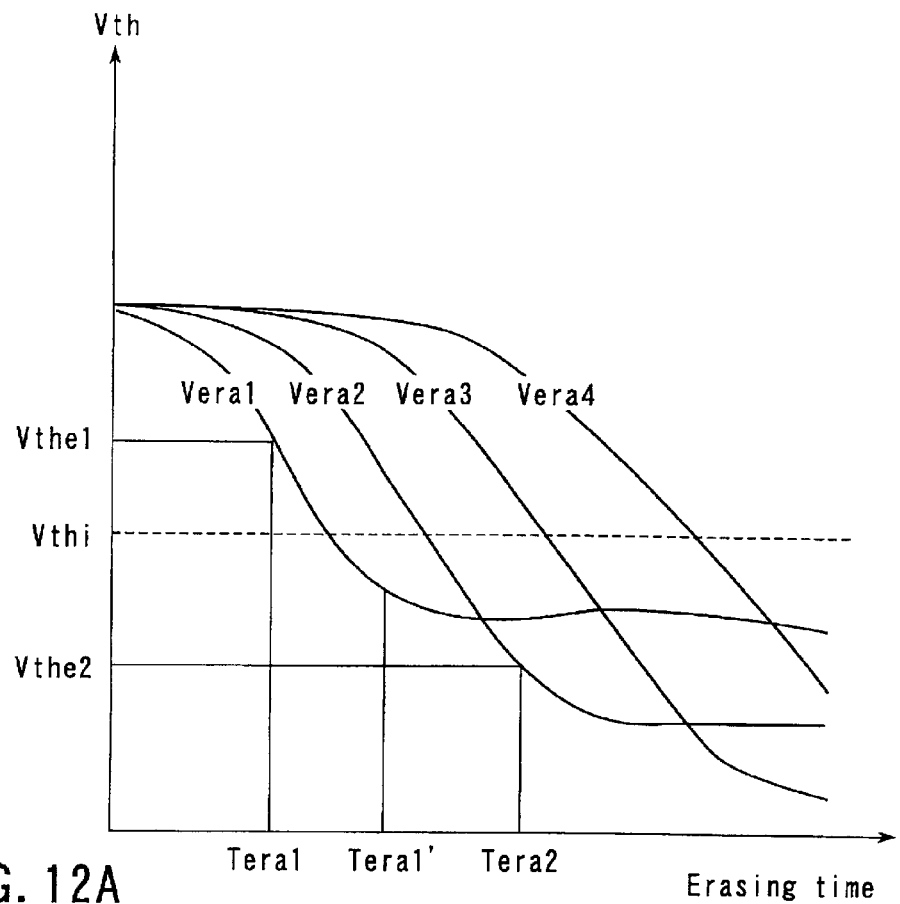
FIG. 12A is a graph showing the relationship between the erasing time and the threshold voltage in a MONOS memory according to the second embodiment.

FIG. 12A is a graph showing the relationship between the erasing time and the threshold voltage of the MONOS memory according to the second embodiment. Referring to FIG. 12A, the abscissa indicates the erasing time, and the ordinate indicates a threshold voltage Vth. FIG. 12A shows characteristics with respect to the absolute values of four different erase voltages Vera1 to Vera4. The absolute values of these voltages decrease in the order of Vera1, Vera2, Vera3, and Vera4.

A saturated erasing depth (a fluctuation amount of an erased-state threshold voltage) is determined by the balance between positive charge injection from the semiconductor substrate and negative charge injection from the gate electrode; the higher the erase voltage, the smaller the saturated erasing depth. Therefore, to erase data deeply, the erase voltage must be lowered, and this prolongs the erasing time. Hence, it is desirable to decrease the erasing depth in order to shorten the erasing time. In the second embodiment, negative charge is stored in the charge storage layer even in the erased state, so the electric field in the block oxide film is not enhanced by positive charge in the charge storage layer. This prevents unnecessary negative charge from being injected from the gate electrode.

Accordingly, it is possible to change the absolute value of the erase voltage from Vera2 to Vera1 and change the erased-state threshold voltage from Vthe2 to Vthe1 which is higher than the neutral threshold voltage. This changes the erasing time from Tera2 to Tera1, i.e., reduces the erasing time. When the erase voltage is Vera1, a mechanism for the erasing characteristic to be saturated after the erasing time is Tera1' is as follows.

Figure 12B:
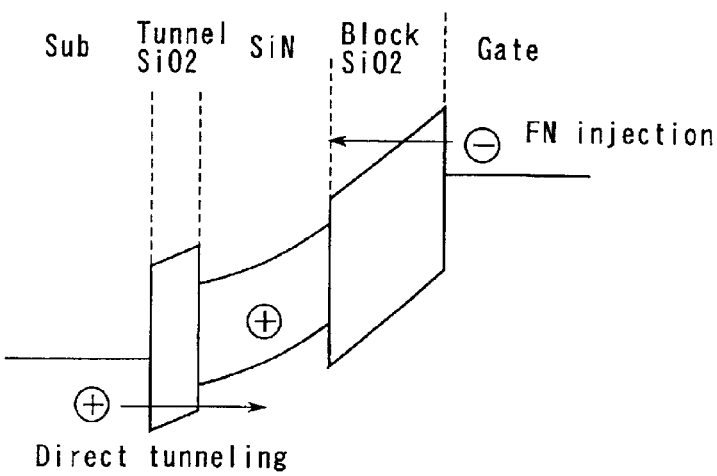
FIG. 12B is a schematic view showing an erase operation in the MONOS memory according to the second embodiment.

FIG. 12B is a schematic view showing an erase operation in the MONOS memory according to the second embodiment.

As shown in FIG. 12B, erasing in this MONOS memory cell is done by injecting positive charge, as indicated by the rightward arrow, from a semiconductor substrate Sub into a charge storage layer (silicon nitride film SiN). In this state, a gate electrode gate is negatively biased with respect to the semiconductor substrate sub. If positive charge (holes) is stored in the charge storage layer SiN during erasing, an electric field in a tunnel oxide film (Tunnel $SiO_2$) is alleviated by a self-field formed by the holes. This reduces the amount of holes injected from the semiconductor substrate Sub into the charge storage layer SiN. Meanwhile, an electric field in a block oxide film Block $SiO_2$ between the charge storage layer SiN and the gate electrode gate is enhanced. Consequently, unnecessary negative charge is injected, as indicated by the leftward arrow, from the gate electrode gate into the charge storage layer SiN by FN (Fowler Nordheim) injection.

Figure 13A:
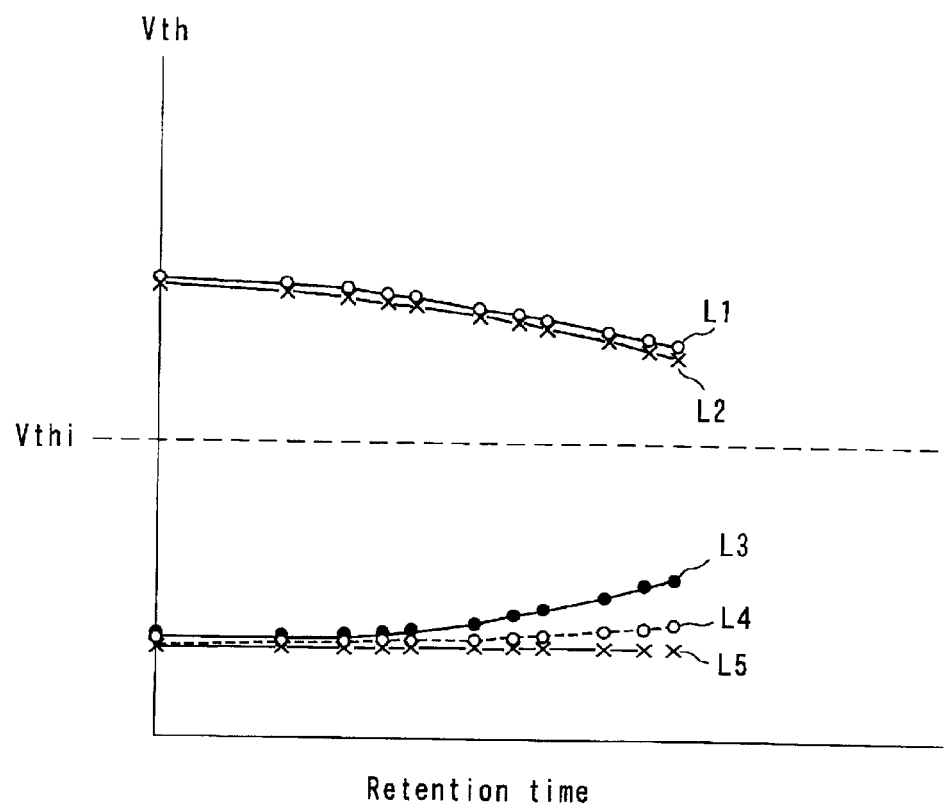
FIG. 13A is a graph showing the dependence of the data retention characteristics upon the charge storage layer SiN film thickness in a MONOS memory cell, obtained by the experiments conducted by the present inventors.
Figure 13B:
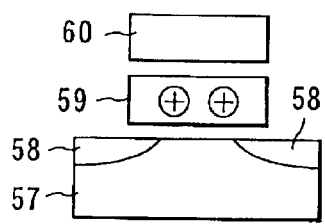
FIGS. 13B and 13C are schematic views showing data storage states, which correspond to the characteristics shown in FIG. 13A, of a memory cell.
Figure 13C:
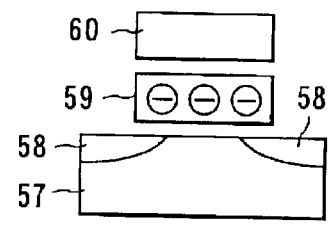

FIG. 13A is a graph showing the dependence of the data retention characteristic upon the film thickness of the charge storage layer SiN in the MONOS memory cell, obtained by the experiments conducted by the present inventors. FIGS. 13B and 13C are schematic views showing those data storage states of the memory cell, which correspond to the characteristics shown in FIG. 13A.

Referring to FIG. 13A, the abscissa indicates the data retention time, and the ordinate indicates the threshold voltage Vth. In FIG. 13A, lines L1 and L2 indicate data retention characteristics in a negative charge stored state when the thickness of the SiN film is 12 and 20 nm, respectively. Lines L3, L4, and L5 indicate data retention characteristics in a positive charge stored state when the thickness of the SiN film is 8, 12, and 20 nm, respectively.

As shown in FIG. 13B, the positive charge stored state is a state in which a slightly large amount of positive charge is stored in the charge storage layer 59 on the semiconductor substrate 57. As shown in FIG. 13C, the negative charge stored state is a state in which a large amount of negative charge is stored in the charge storage layer 59 on the semiconductor substrate 57.

The present inventors found that the data retention characteristic in the positive charge stored state depended on the SiN film thickness, and that deterioration of the data retention characteristic was especially significant when the SiN film thickness was 15 nm or less, particularly, 12 nm or less as shown in FIG. 13A. The data retention characteristic in the negative charge stored state was independent of the SiN film thickness; no deterioration of the data retention characteristic was observed even when the thickness of the SiN film was decreased.

In the second embodiment, the negative charge stored state is used in both write and erase. Therefore, even when the thickness of the SiN film is decreased to lower the write and erase voltages, the data retention characteristic does not deteriorate. This is advantageous in lowering these voltages. The effect is especially notable when the physical film thickness of the SiN film is 15 nm or less, particularly, 12 nm or less. In this case, the write/erase voltages can be lowered to 20 V or less.

Also, in the second embodiment, no positive charge is stored in the erased state, so deterioration of the reliability by repetitive programming can be avoided. From these respects, the effect of this second embodiment is particularly remarkable in a MONOS cell using an SiN film as a charge storage layer. The second embodiment can be implemented by performing an operation of storing negative charge in the first embodiment.

Note that equivalent circuit diagrams, plan views, and sectional views when the second embodiment is applied to a NAND EEPROM are analogous to those of the first embodiment explained with reference to FIGS. 4A to 7B.

First Modification of Second Embodiment

FIGS. 14A and 14B are an equivalent circuit diagram and a plan view, respectively, showing a NOR EEPROM according to the first modification of the second embodiment of the present invention.

In this NOR EEPROM, one terminal of a memory cell transistor M0 is connected to a bit line BL1, and one terminal of another memory cell transistor M1 is connected to the other terminal of the memory cell transistor M0. The other terminal of the memory cell transistor M1 is connected to the bit line BL1 and to one terminal of still another memory ell transistor M2. In addition, a second bit line BL2 runs parallel to the first bit line BL1. Similar to the first bit line BL1, a plurality of memory cell transistors M0' to M2' are connected to the second bit line BL2.

In a NOR memory cell, one transistor forms one memory cell block. The individual transistors are formed on the same well. The control electrodes of the individual memory cells are connected to data select lines WL0 to WL2.

FIG. 14B is a plan view of this NOR EEPROM. For a better understanding of the cell structure, only a structure below the gate electrode is shown. As shown in FIG. 14B, three bit lines BLi (i is a natural number) run in the longitudinal direction, and two common source lines SL run perpendicular to these bit lines BLi. In addition, word lines WL0 to WL2 run parallel to the common source lines SL. Bit line contacts 61 are formed in those portions on the bit lines BLi, which do not intersect the word lines WL0 to WL2.

FIG. 15 is a sectional view taken along a line A-B in FIG. 14B, when the memory cell is a floating gate type memory cell. In this case, a sectional view taken along a line C-D in FIG. 14B is the same as FIG. 7B.

Analogous to FIG. 7A, an n-well 5 is formed on a p-semiconductor substrate 4, and a p-well 6 is formed on this n-well 5. On top of this p-well 6, a charge storage layer 31 is formed via a tunnel gate insulating film 30. This tunnel gate insulating film 30 is, e.g., a 3- to 15-nm thick silicon oxide film or oxynitride film. The charge storage layer 31 is, e.g., a 10- to 500-nm thick polysilicon layer doped with $10^{18}$ to $10^{21}$ cm$^{-3}$ of phosphorus or arsenic. As shown in FIG. 7B, the charge storage layer 31 and the like are formed to be self-aligned with the p-well 6 on a region where an element isolation insulating film 26 made of a silicon oxide film is not formed.

On the charge storage layer 31, control gate electrodes 33 are formed via an inter-poly-Si insulating film 32. This inter-poly-Si insulating film 32 is, e.g., a 5- to 30-nm thick silicon oxide film, oxynitride film, or silicon oxide film/silicon nitride film/silicon oxide film. The control gate electrode 33 has a thickness of, e.g., 10 to 500 nm and has a stacked structure of WSi (tungsten silicide) and polysilicon, a stacked structure of CoSi and polysilicon, a stacked structure of metal and polysilicon, or a single-layered structure of metal, polysilicon, WSi, NiSi, MoSi, TiSi, or CoSi. A gate cap insulating film 34 is formed on the control gate electrodes 33.

The side surfaces of the gate cap insulating film 34, the control gate electrode 33, the inter-poly-Si insulating film 32, the charge storage layer 31, and the tunnel gate insulating film 30 are covered with a gate side wall insulating film 35. In this manner, memory cell gates 36 are formed. The gate length of the charge storage layer 31 is set to 0.01 to 0.5 μm.

As shown in FIG. 15, on one side of each memory cell gate 36, an n-diffusion layer 37 serving as a source or drain is formed. On the other side of the memory cell gate 36, an n-diffusion layer 18 connected to a data transfer line 19 via the contact 61 and serving as a source or drain is formed. These source/drain n-diffusion layers 18 and 37 and the memory cell gate 36 form a floating gate type EEPROM in which the charge amount stored in the charge storage layer 31 is the information amount. The source/drain n-diffusion layers 18 and 37 are shared by adjacent memory cells to realize NOR connections.

A portion between the data transfer line 19 and the p-well 6 is filled with an interlayer 24 made of, e.g., SiO$_2$ or SiN and having a thickness of, e.g., 5 to 200 nm. On the data transfer line 19, an insulating film protective layer 25 is formed. On this protective layer 25, an upper interconnection (not shown) is formed as needed.

FIG. 16 is a sectional view taken along the line A-B in FIG. 14B, when the memory cell is a MONOS memory cell. A sectional view taken along the line C-D in FIG. 14B is the same as FIG. 5B. As shown in FIG. 16, this sectional structure is the same as FIG. 15 except that the MONOS memory cell gate 13 shown in FIG. SA is used instead of the floating gate type memory cell gate 36 shown in FIG. 15.

Second Modification of Second Embodiment

Figure 17A:
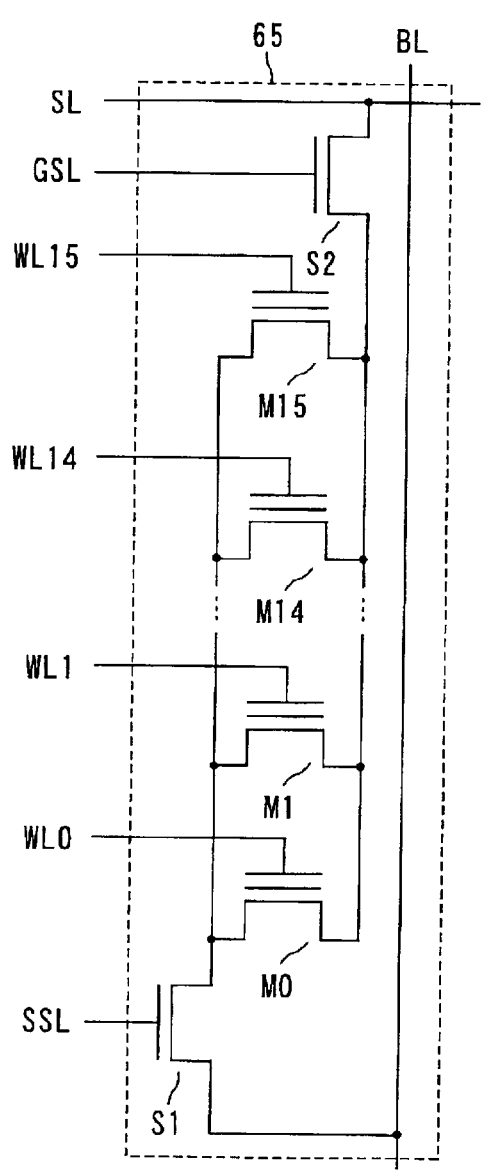
FIGS. 17A and 17B are an equivalent circuit diagram and a plan view, respectively, showing an AND EEPROM having floating gate type memory cells according to the second modification of the second embodiment of the present invention.
Figure 17B:
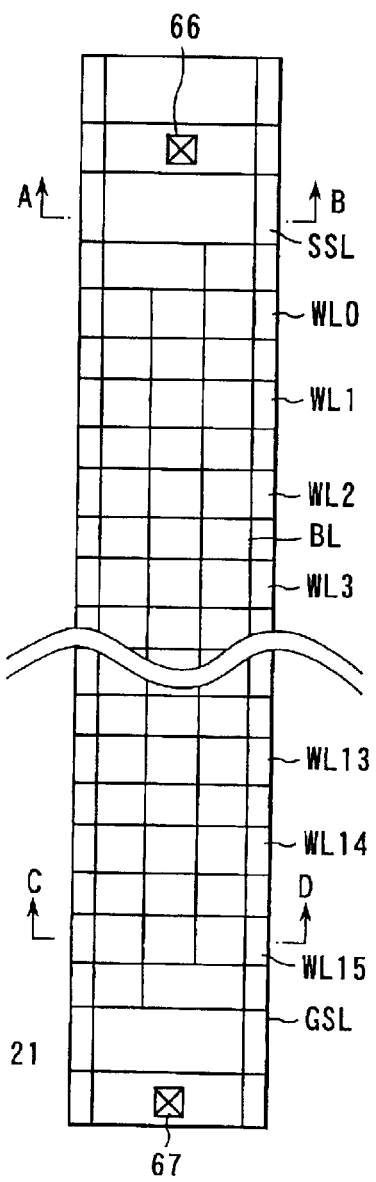

FIGS. 17A and 17B are an equivalent circuit diagram and a plan view, respectively, showing an AND EEPROM having floating gate type memory cells according to the second modification of the second embodiment of the present invention.

This AND EEPROM has a first selection transistor S1 having a terminal connected to a bit line BL, and a second selection transistor S2 having a terminal connected to a common source line SL. Between these selection transistors S1 and S2, a plurality of floating gate type memory cell transistors M0 to M15 are connected in parallel to form a memory cell block 65. These transistors are formed on the same well.

The control electrodes of the memory cells M0 to M15 are connected to data select lines WL0 to WL15. To select one memory cell block from a plurality of memory cell blocks along a data transfer line and connect the selected memory cell block to the data transfer line, the control electrode of the selection transistor S1 is connected to a block select line SSL. The control electrode of the selection transistor S2 is connected to a block select line GSL.

In this modification, 16, i.e., $2^4$ memory cells are connected to the memory cell block 65. However, it is only necessary to connect a plurality of memory cells to the data transfer line BL and the data select lines WL0 to WL15. The number of memory cells is desirably $2^N$ (N is a positive integer) in order to perform address decoding.

FIG. 17B is a plan view of this AND EEPROM. For a better understanding of the cell structure, only a structure below the gate electrode is shown. As shown in FIG. 17B, a bit line contact 66 is formed on the block select line SSL running in the lateral direction. This bit line contact 66 supplies a potential from the bit line BL running in the longitudinal direction to the diffusion layer of the selection transistor S1. A common source line contact 67 is formed below the block select line GSL running in the lateral direction of FIG. 17B. This common source line contact 67 supplies a potential from the common source line SL to the selection transistor S2.

Figure 18A:
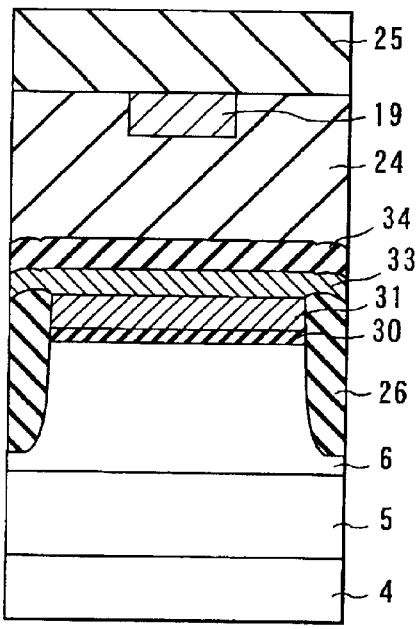
FIGS. 18A and 18B are sectional views taken along lines A-B, and C-D, respectively, in FIG. 17B.
Figure 18B:
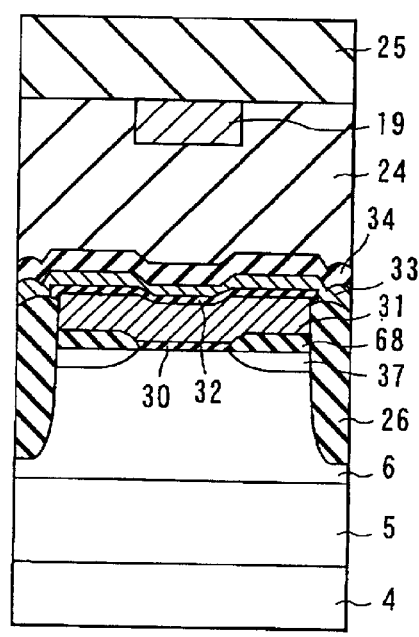

FIGS. 18A and 18B are sectional views taken along lines A-B and C-D, respectively, in FIG. 17B.

As shown in FIGS. 18A and 18B, an n-well 5 is formed on a p-semiconductor substrate 4, and a p-well 6 is formed on this n-well 5. On top of this p-well 6, a charge storage layer 31 is formed via a tunnel gate insulating film 30. This tunnel gate insulating film 30 is, e.g., a 3- to 15-nm thick silicon oxide film or oxynitride film. The charge storage layer 31 is, e.g., a 10- to 500-nm thick polysilicon layer doped with $10^{18}$ to $10^{21}$ cm$^{-3}$ of phosphorus or arsenic. The charge storage layer 31 and the like are formed to be self-aligned with the p-well 6 on a region where an element isolation insulating film 26 made of a silicon oxide film is not formed.

To form this structure, the tunnel gate insulating film 30 and the charge storage layer 31 are first deposited on the entire surface of the p-well 6. These layers are then etched to a depth of, e.g., 0.05 to 0.5 µm of the p-well 6, thereby forming trenches. An insulating film is buried in these trenches to form an element isolation insulating film 26.

In this method, the tunnel gate insulating film 30 and the charge storage layer 31 can be formed on an entire flat surface with little steps. Therefore, film formation having uniform characteristics can be performed with improved uniformity. Also, a dielectric interlayer 68 and an n-diffusion layer 37 in a cell portion can be formed in self-alignment. That is, before the tunnel insulating film 30 is formed, a polysilicon mask material is formed in a portion where this tunnel insulating film 30 is to be formed, and the n-diffusion layer 37 is formed by ion implantation. Subsequently, the dielectric interlayer 68 is deposited on the entire surface, and the mask material in the portion corresponding to the tunnel insulating film 30 is selectively removed by CMP (Chemical Mechanical Polishing) and etch back.

On the charge storage layer 31, control gate electrodes 33 are formed via an inter-poly-Si insulating film 32. This inter-poly-Si insulating film 32 is, e.g., a 5- to 30-nm thick silicon oxide film, oxynitride film, or silicon oxide film/silicon nitride film/silicon oxide film. The control gate electrode 33 has a thickness of, e.g., 10 to 500 nm and has a stacked structure of WSi (tungsten silicide) and polysilicon, a stacked structure of CoSi and polysilicon, a stacked structure of metal and polysilicon, or a single-layered structure of metal, polysilicon, WSi, NiSi, MoSi, TiSi, or CoSi. A gate cap insulating film 34 is formed on the control gate electrodes 33.

The control gate electrodes 33 are formed to block boundaries in the lateral direction of the paper surface of FIG. 18B, so as to be connected between the memory cell blocks adjacent in FIG. 17B, thereby forming the data select lines WL0 to WL15 and the block select lines SSL and GSL. Note that a voltage is preferably applied to the p-well 6 by the n-well 5 independently of the p-semiconductor substrate 4, in order to reduce the step-up circuit load during erasing and suppress the power consumption. The p-well 6 in a memory cell portion is surrounded by the n-well 5. When an erase voltage is applied to this p-well 6, therefore, the voltage is not raised except in the memory cell portion, and this can suppress the power consumption.

As shown in FIG. 18B, below these gate electrodes in a section corresponding to a memory cell, n-diffusion layers 37 serving as a source or drain electrode are formed with the dielectric interlayer 68 sandwiched between them. The dielectric interlayer 68 is, e.g., a 5- to 200-nm thick silicon oxide film or oxynitride film. The n-diffusion layers 37, the charge storage layer 31, and the control gate electrode 33 form a floating gate type EEPROM cell in which the charge amount stored in the charge storage layer is the information amount. The gate length of the charge storage layer is set to 0.01 to 0.5 µm.

As shown in FIG. 18B, the dielectric interlayer 68 is preferably also formed on the channel so as to cover the source/drain electrodes 37, in order to prevent abnormal write caused by field concentrations at the source/drain ends. The source/drain diffusion layers 37 are formed to a depth of 10 to 500 nm so that the surface impurity concentration of phosphorus, arsenic, or antimony is $10^{17}$ to $10^{21}$ cm$^{-3}$. The n-diffusion layers 37 are shared by adjacent memory cells to realize AND connections.

The control gate electrode 33 is connected to the block select lines SSL and GSL. These block select lines SSL and GSL are formed by the same layer as the data select lines WL0 to WL15. In block select line portions, therefore, the inter-poly-Si insulating film 32 is removed from a portion between the charge storage layer 31 and the control gate electrode 33.

As shown in FIGS. 17B and 18A, the block select transistor S1 is formed as a MOSFET having the n-diffusion layers 37 as source and drain electrodes and the control gate electrode 33 as a gate electrode. The block select transistor S2 is formed as a MOSFET having the n-diffusion layers 37 as source and drain electrodes and the control data electrode 33 as a gate electrode. The gate length of the gate electrodes of these block select transistors S1 and S2 is set to be larger than the gate length of the gate electrode of a memory cell, e.g., 0.02 to 1 µm. This can ensure a high ON/OFF ratio of block selection to non-block selection, and prevent write and read errors.

Figure 19A:
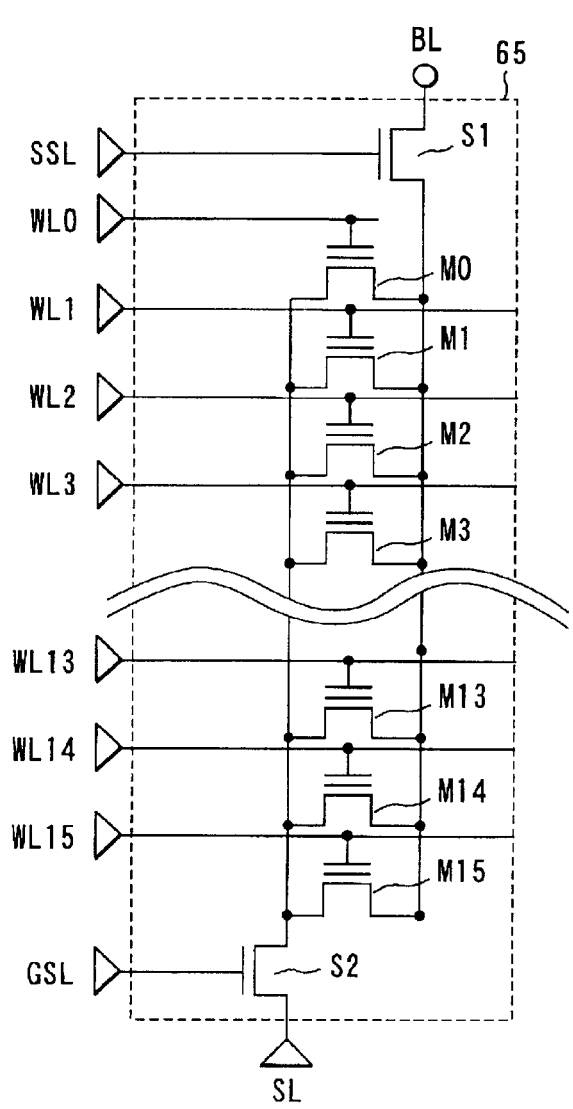
FIGS. 19A and 19B are an equivalent circuit diagram and a plan view, respectively, showing an AND EEPROM having MONOS type memory cells according to the second modification of the second embodiment of the present invention.
Figure 19B:
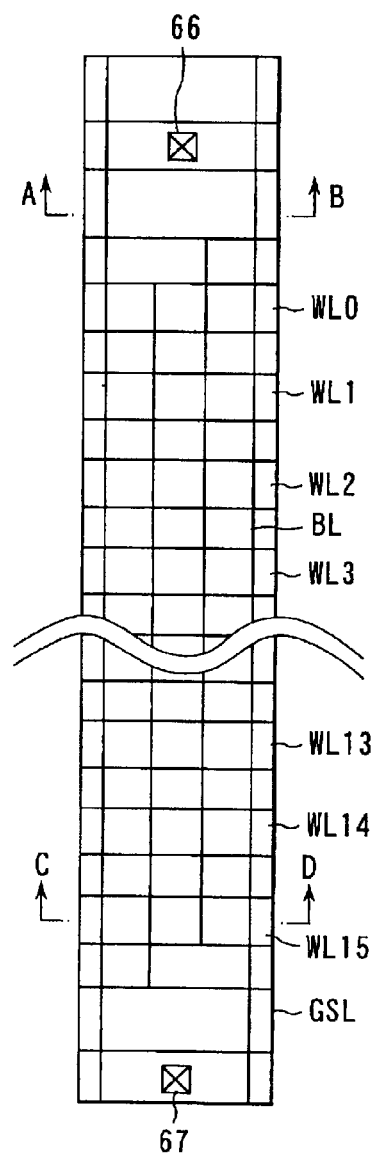

FIGS. 19A and 19B are an equivalent circuit diagram and a plan view, respectively, showing an AND EEPROM having MONOS memory cells according to the second modification of the second embodiment of the present invention.

This AND EEPROM has a first selection transistor S1 having a terminal connected to a bit line BL, and a second selection transistor S2 having a terminal connected to a common source line SL. Between these selection transistors S1 and S2, a plurality of MONOS memory cell transistors M0 to M15 are connected in parallel to form a memory cell block 65. These transistors are formed on the same well.

The control electrodes of the memory cells M0 to M15 are connected to data select lines WL0 to WL15. To select one memory cell block from a plurality of memory cell blocks along a data transfer line and connect the selected memory cell block to the data transfer line, the control electrode of the selection transistor S1 is connected to a block select line SSL. The control electrode of the selection transistor S2 is connected to a block select line GSL.

In this modification, 16, i.e., $2^4$ memory cells are connected to the memory cell block 65. However, it is only necessary to connect a plurality of memory cells to the data transfer line BL and the data select lines WL0 to WL15. The number of memory cells is desirably $2^N$ (N is a positive integer) in order to perform address decoding.

FIG. 19B is a plan view of this AND EEPROM. For a better understanding of the cell structure, only a structure below the gate electrode is shown. As shown in FIG. 19B, a bit line contact 66 is formed on the block select line SSL running in the lateral direction. This bit line contact 66 supplies a potential from the bit line BL running in the longitudinal direction to the diffusion layer of the selection transistor S1. A common source line contact 67 is formed below the block select line GSL running in the lateral direction of FIG. 19B. This common source line contact 67 supplies a potential from the common source line SL to the selection transistor S2.

Figure 20A:
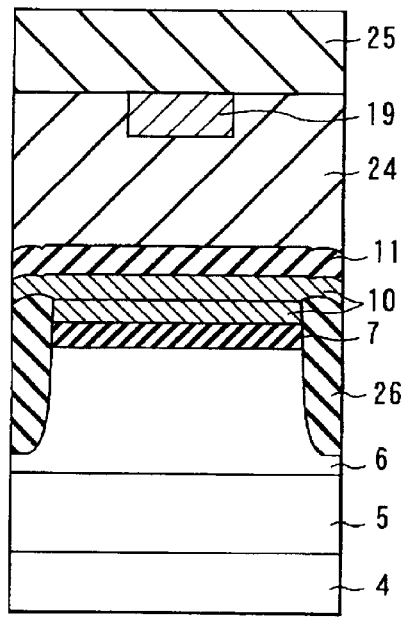
FIGS. 20A and 20B are sectional views taken along lines A-B, and C-D, respectively, in FIG. 19B.
Figure 20B:
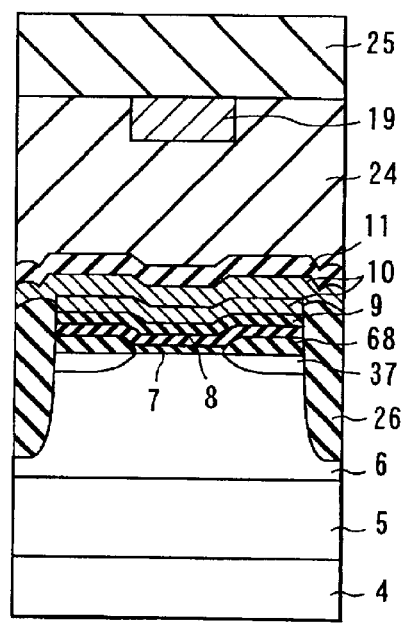

FIGS. 20A and 20B are sectional views taken along lines A-B and C-D, respectively, in FIG. 19B.

As shown in FIGS. 20A and 20B, an n-well 5 is formed on a p-semiconductor substrate 4, and a p-well 6 is formed on this n-well 5. On top of this p-well 6, a charge storage layer 8 is formed via a tunnel gate insulating film 7. This tunnel gate insulating film 7 is, e.g., a 0.5- to 10-nm thick silicon oxide film or oxynitride film. The charge storage layer 8 is, e.g., a 4- to 50-nm thick silicon nitride layer.

On this charge storage layer 8, a control gate electrode 10 is formed via a block insulating film 9. This block insulating film 9 is, e.g., a 2- to 30-nm thick silicon oxide film or oxynitride film. The control gate electrode 10 has a thickness of, e.g., 10 to 500 nm and is made of polysilicon or has a stacked structure of WSi (tungsten silicide) and polysilicon, or a stacked structure of NiSi, MoSi, TiSi, or CoSi and polysilicon. A gate cap insulating film 11 is formed on the control gate electrode 10. The charge storage layer 8 and the like are formed to be self-aligned with the p-well 6 on a region where an element isolation insulating film 26 made of a silicon oxide film is not formed.

To form this structure, the tunnel gate insulating film 7, the charge storage layer 8, the block insulating film 9, and the control gate electrode 10 are first deposited on the entire surface of the p-well 6. These layers are then etched to a depth of, e.g., 0.05 to 0.5 $\mu$m of the p-well 6, thereby forming trenches. An insulating film is buried in these trenches to form an element isolation insulating film 26.

In this method, the tunnel gate insulating film 7, the charge storage layer 8, and the block insulating film 9 can be formed on an entire flat surface with little steps. Therefore, film formation having uniform characteristics can be performed with improved uniformity. Also, a dielectric interlayer 68 and n-diffusion layers 37 in a cell portion can be formed in self-alignment. That is, before the tunnel insulating film 7 is formed, a polysilicon mask material is formed in a portion where this tunnel insulating film 7 is to be formed, and n-diffusion layers 37 are formed by ion implantation. Subsequently, a dielectric interlayer 68 is deposited on the entire surface, and the mask material in the portion corresponding to the tunnel insulating film 7 is selectively removed by CMP (Chemical Mechanical Polishing) and etch back. The rest is the same as the structure shown in FIGS. 18A and 18B, so a detailed description thereof will be omitted.

Since the devices shown in FIGS. 5A, 5B, 6B, 16, 20A, and 20B use MONOS cells, the write and erase voltages can be lowered compared to those in a floating gate type EEPROM cell. Accordingly, a given withstand voltage can be maintained even when the element isolation interval is narrowed to decrease the thickness of the gate insulating film. This makes it possible to decrease the area of a circuit to which a high voltage is applied, and further reduce the chip area.

Also, compared to a floating gate type memory cell, the thickness of the charge storage layer 8 can be decreased to 20 nm or less, so the aspect in gate formation can be decreased. Additionally, it is possible to improve the processed shape of the gate electrode, improve the quality of the dielectric interlayer 24 buried between the gates, and improve the withstand voltage.

Furthermore, since neither a floating gate formation process nor a slit formation process is necessary, the process steps can be further reduced. Also, the charge storage layer 8 is an insulator, so electric charge is captured in each individual charge trap. Therefore, electric charge is not easily extracted by radiation, and this gives the device a high resistance.

In the device shown in FIGS. 19A to 20B, a selection transistor has a MOS structure. However, this selection transistor can also have the same MONOS structure as a memory cell. Since the steps for separately forming selection transistors and memory cell transistors can be omitted in this case, the fabrication cost can be reduced. In addition, no margin for separate formation is necessary, so the distance between selection transistors and memory cells can be decreased. This can reduce the device area.

Furthermore, since a negative charge stored state is used in both write and erase, the data retention characteristic of the nonvolatile semiconductor memory can be improved. In particular, the data retention characteristic in an erased state after repetitive programming can be improved.

Also, in a MONOS memory cell, it is possible to reduce the erasing time and avoid deterioration of the data retention characteristic resulting from a decrease in the SiN thickness. Hence, the SiN thickness can be decreased to 12 nm or less, and this is advantageous in lowering voltages. Since no positive charge storage state is used, the reliability after repetitive programming can be improved. As a matter of course, even where the memory cells in the erased state mixedly include cells storing positive charge and cells storing negative charge, as shown in FIG. 9, the effects described above are obtained.

If the neutral threshold voltage is higher than 0 V, "a negative charge stored state is used in both write and erase" means "the threshold voltages of both write and erase are positive". In a case like this, effects similar to those of the second embodiment can also be obtained in the first embodiment.

Third Embodiment

Figure 21A:
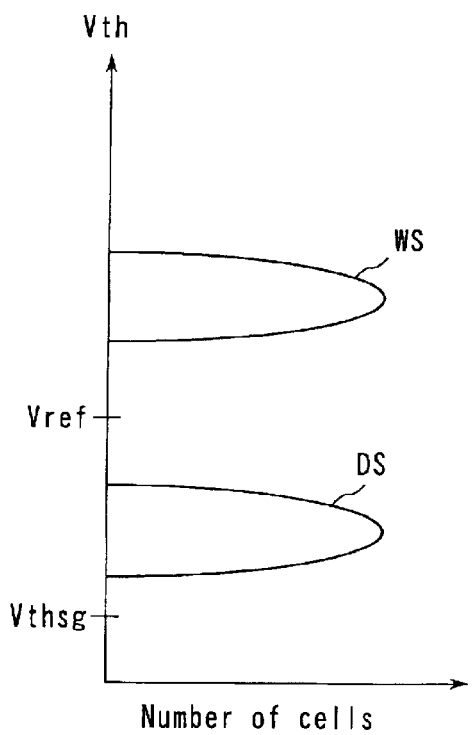
FIGS. 21A and 21B are graphs showing two examples of threshold voltage distributions corresponding to data storage states (an erased state and written state) in a memory according to the third embodiment of the present invention.
Figure 21B:
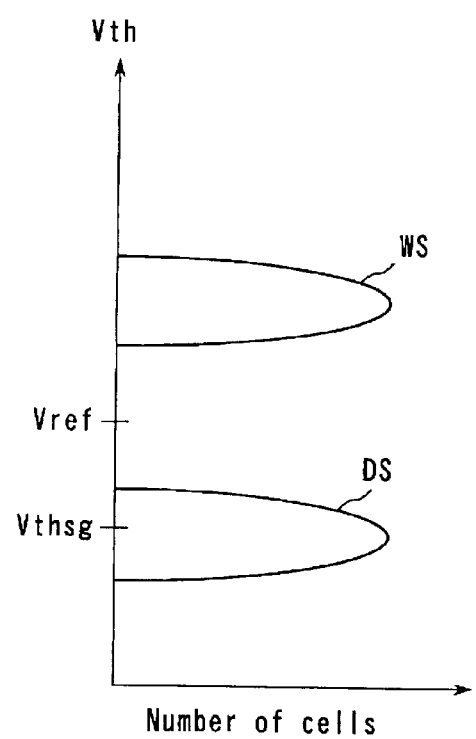

FIGS. 21A and 21B are graphs showing two examples of threshold voltage distributions corresponding to data storage states (an erased state DS and a written state WS) in a device according to the third embodiment of the present invention. Referring to FIGS. 21A and 21B, the abscissa indicates the number of memory cell transistors, and the ordinate indicates the magnitude of the threshold voltage.

FIG. 21A is characterized in that threshold voltages in both the written state and erased state are higher than the threshold voltage of a selection transistor. As shown in FIG. 21A, in the written state WS, all the threshold voltages of the memory cells are distributed at values larger than a read voltage Vref. In the erased state DS, all the threshold voltages of the memory cells are distributed at values smaller than the read voltage Vref and larger than a threshold voltage Vthsg of the selection transistor.

The characteristic feature of FIG. 21B is that in the erased state DS, the threshold voltages of the memory cells are distributed across the threshold voltage Vthsg of the selection transistor. That is, the threshold voltage of the selection transistor is present within the range of the threshold voltage distribution in the erased state DS. In the written state WS, on the other hand, all the threshold voltages of the memory cells are distributed at values larger than the read voltage Vref.

Figure 22A:
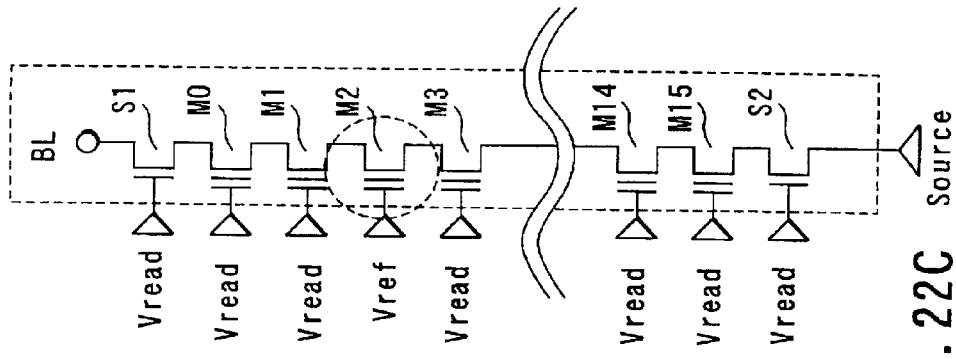
FIG. 22A is a circuit diagram showing a NAND EEPROM as a semiconductor memory according to the third embodiment of the present invention.

FIG. 22A is a circuit diagram showing a NAND EEPROM as a semiconductor memory according to the third embodiment of the present invention.

In this memory shown in FIG. 22A, a read operation performed under the control of a driver/controller DRC is as follows. That is, a bit line BL is set to float after being precharged, and a source line Source is set at 0 V. In this state, the voltage of the control gate electrode of a memory cell (transistor) M2 selected for data read is set at the read voltage Vref, the voltages of the control gate electrodes of other memory cells M0, M1, and M3 to M15 are set at a non-selection read voltage Vread, and the gate voltages of first and second selection transistors S1 and S2 are set at a power supply voltage Vcc. Data is read by checking, by the bit line BL, whether an electric current flows through the memory cell M2 selected for data read.

If a threshold voltage Vth of this memory cell M2 selected for data read is larger than the read voltage Vref, the memory cell M2 is turned off, so the bit line BL maintains the precharge voltage. If the threshold voltage Vth of the memory cell M2 selected for data read is smaller than the read voltage Vref, the memory cell M2 is turned on, so the potential of the bit line BL lowers from the precharge potential by $\Delta V$. Data in the memory cell M2 is read out by sensing this potential change by a sense amplifier SEA in a data circuit CID connected to the bit line.

The read voltage Vref is intermediate between the threshold voltage in the written state and that in the erased state. The non-selection read voltage Vread is higher than the threshold voltage in the written state. The power supply voltage Vcc is higher than the threshold voltage of the selection transistor.

Figure 22B:
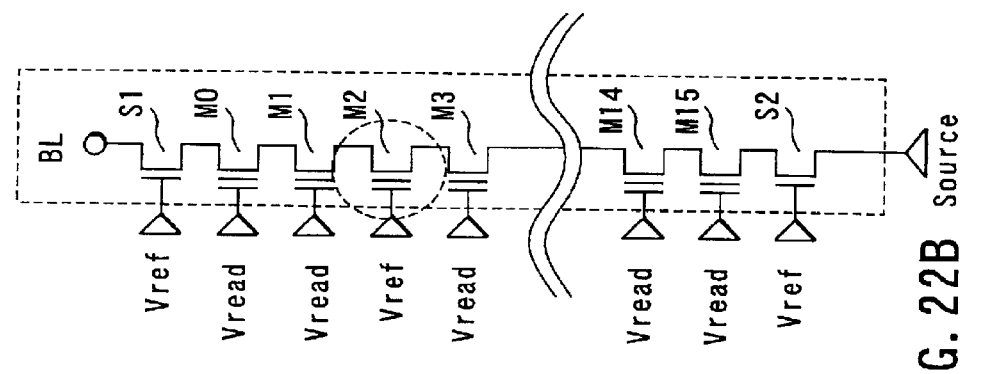
FIGS. 22B and 22C are circuit diagrams showing a NAND EEPROM according to a modification of the third embodiment.
Figure 22C:
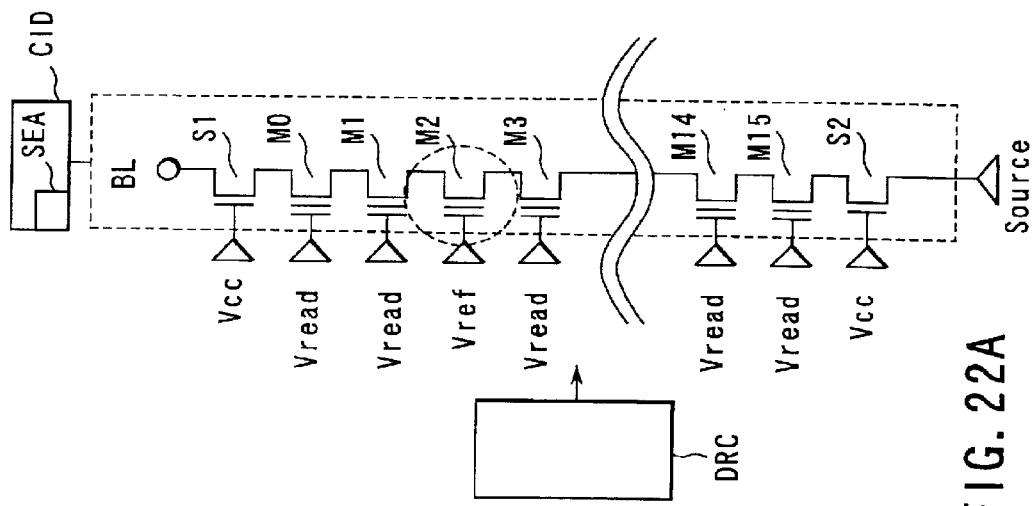

FIGS. 22B and 22C are circuit diagrams showing NAND EEPROMs according to modifications of the third embodiment.

In the device shown in FIG. 22B, the read voltage Vref, instead of the power supply voltage Vcc, is applied to the gates of the selection transistors S1 and S2 in read operation. The selection transistors in a selected NAND cell block need to be turned on (to be conductive) in read operation. In this respect, as shown in FIGS. 21A and 21B, where the threshold voltage of the selection transistors is set to be lower than the threshold voltage distribution of memory cells in the erased state, or to fall within the range of the threshold voltage distribution of memory cells in the erased state, the selection transistors can be turned on by applying the read voltage Vref to the control gates.

In the device shown in FIG. 22C, the non-selection read voltage Vread, instead of the power supply voltage Vcc, is applied to the gates of the selection transistors S1 and S2 in read operation. In this device shown in FIG. 22C, Vread or Vref can be set to be equal to Vcc. In either case, the number of types of voltages used in data read reduces. This can simplify peripheral circuits and reduce the area and the number of fabrication steps.

FIG. 23A is a circuit diagram showing an AND EEPROM as another semiconductor memory according to the third embodiment of the present invention.

A read operation performed under the control of a driver/controller DRC in the memory shown in FIG. 23A is as follows. That is, a bit line BL is set to float after being precharged, and a source line Source is set at 0 V. In this state, the voltage of the control gate electrode of a memory cell (transistor) M2 selected for data read is set at a read voltage Vref, the voltages of the control gate electrodes of other memory cells M0, M1, and M3 to M15 are set at a non-selection read voltage Vread, and the gate voltages of first and second selection transistors S1 and S2 are set at a power supply voltage Vcc. Data is read by checking, by the bit line BL, whether an electric current flows through the memory cell M2 selected for data read.

If a threshold voltage Vth of this memory cell M2 selected for data read is larger than the read voltage Vref, the memory cell M2 is turned off, so the bit line BL maintains the precharge voltage. If the threshold voltage Vth of the memory cell M2 selected for data read is smaller than the read voltage Vref, the memory cell M2 is turned on, so the potential of the bit line BL lowers from the precharge potential by $\Delta V$. Data in the memory cell M2 is read out by sensing this potential change by a sense amplifier SEA in a data circuit CID connected to the bit line.

The read voltage Vref is intermediate between the threshold voltage in the written state and that in the erased state. The non-selection read voltage Vread is lower than the threshold voltage in the erased state. The power supply voltage Vcc is higher than the threshold voltage of the selection transistor.

FIGS. 23B and 23C are circuit diagrams showing AND EEPROMs according to modifications of the third embodiment.

In the device shown in FIG. 23B, the read voltage Vref, instead of the power supply voltage Vcc, is applied to the gates of the selection transistors S1 and S2 in read operation. The selection transistors in a selected NAND cell block need to be turned on (to be conductive) in read operation. In this respect, as shown in FIGS. 21A and 21B, where the threshold voltage of the selection transistors is set to be lower than the threshold voltage distribution of memory cells in the erased state, or to fall within the range of the threshold voltage distribution of memory cells in the erased state, the selection transistors can be turned on by applying the read voltage Vref to the control gates.

In the device shown in FIG. 23C, the non-selection read voltage Vread, instead of the power supply voltage Vcc, is applied to the gates of the selection transistors S1 and S2 in read operation. In this device shown in FIG. 23C, Vread or Vref can be set to be equal to Vcc. In either case, the number of types of voltages used in data read reduces. This can simplify peripheral circuits and reduce the area and the number of fabrication steps.

In the equivalent circuit diagrams shown in FIGS. 22A to 23C, the selection transistor has a MOS structure. However, this selection transistor can also have the same MONOS structure as the memory cell. Since the steps for separately forming selection transistors and memory cell transistors can be omitted in this case, the fabrication cost can be reduced. In addition, no margin for separate formation is necessary, so the distance between selection transistors and memory cells can be decreased. This can reduce the device area.

In a read operation of a NAND or AND EEPROM, an electric current flowing through a bit line is mainly determined by the channel conductance of a memory cell selected for data read. This electric current flowing through a bit line is also influenced by the channel conductance of a selection transistor. That is, the electric current is influenced by threshold voltage variations of the selection transistor to cause read errors. To avoid this problem, it is desirable that the threshold voltage distribution of the selection transistor be much lower than the voltage applied to a selection gate in read operation, and thereby the channel conductance of the selection transistor be much larger than that of a memory cell.

"The channel conductance of the selection transistor is much larger than that of a memory cell" indicates the range within which the electric current flowing through the bit line during data read does not fluctuate owing to fluctuation in the threshold voltage of the selection transistor. For example, letting Vthsg be the threshold voltage of the selection transistor, Vthw be the threshold voltage in the written state of the memory cell, Vthe be the threshold voltage in the erased state of the memory cell, Vsg be the selection gate voltage, and Vread be the non-selection read gate voltage, it is preferable to satisfy the following formulas (8) and (9).

$$(Vsg-Vthsg) \geq (Vref-Vthe) \quad (8)$$

$$(Vsg-Vthsg) \geq (Vread-Vthw) \quad (9)$$

In the third embodiment, the threshold voltage of the selection transistor is equal to or lower than the threshold voltage of the memory cell. Accordingly, when data is read out by setting Vsg=Vref or Vsg=Vread, the channel conductance of the selection transistor is always sufficiently high, as compared to the channel conductance of the memory cell, so threshold voltage variations of the selection transistor have no influence on the bit line current. In addition, the same voltage as applied to the control gate electrode of a selected or non-selected memory cell can be applied to the selection gate in read operation. As a consequence, the circuit can be simplified.

In the third embodiment, the selection transistor can have the same electrically erasable and programmable structure as the memory cell. In this case, if the same voltage as applied to the memory cell is applied to the selection transistor when data in the memory cell is erased, the threshold voltage of the selection transistor can be made equal to the erased-state threshold voltage of the memory cell. If a voltage higher than that of the memory cell is applied to the selection transistor when data in the memory cell is erased, an erased-state threshold voltage lower than that of the memory cell can be achieved.

Equivalent circuit diagrams, plan views, and sectional views when the third embodiment is applied to a NAND EEPROM are similar to those of the first embodiment explained with reference to FIGS. 4A to 7B. Also, equivalent circuit diagrams, plan views, and sectional views when the third embodiment is applied to an AND EEPROM are analogous to those of the second embodiment explained with reference to FIGS. 17A to 20B.

Figure 32A:
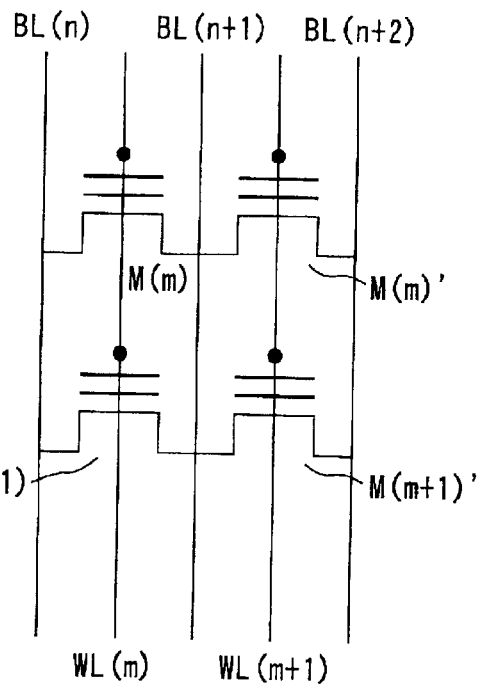
FIGS. 32A and 32B are circuit diagrams showing virtual ground array memories to which the first to third embodiments may be applied.
Figure 32B:
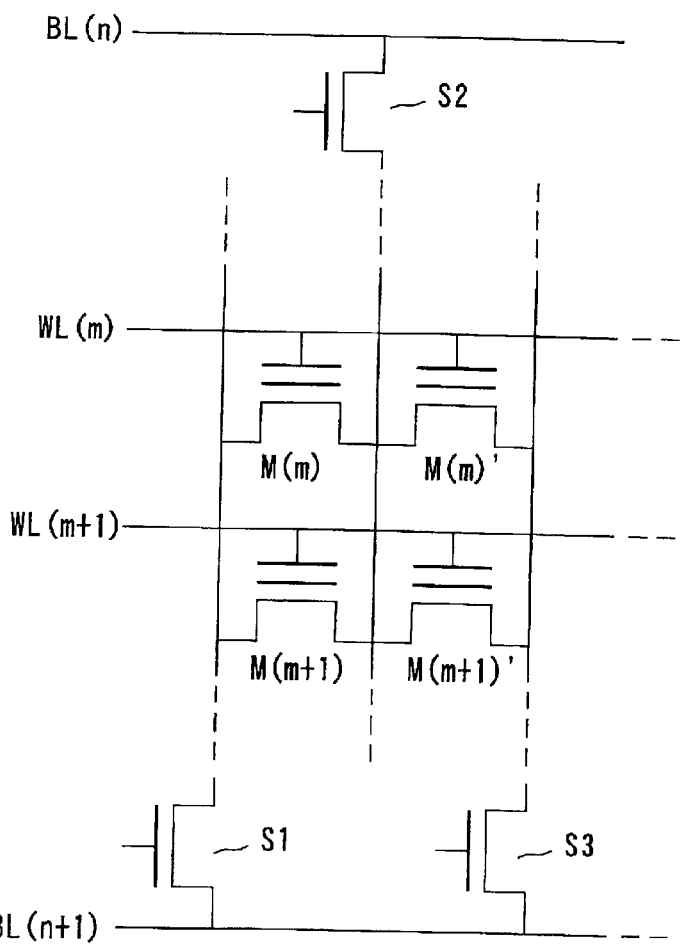

The first to third embodiments of the present invention described above have been explained by taking NAND, NOR, and AND EEPROMs as examples. However, these embodiments are also applicable to memories such as a DINOR memory, a virtual ground array memory. FIGS. 32A and 32B are circuit diagrams showing virtual ground array memories to which the first to third embodiments may be applied. In addition, the first to third embodiments have been explained by taking a floating gate type structure and a MONOS structure as examples of a memory cell structure. However, these embodiments can also be applied to other semiconductor memories having a charge storage layer.

In a MONOS memory, a gate electrode has a single-layered structure, so a voltage applied to the gate is entirely applied to an ONO (Oxide-Nitride-Oxide) film below a charge storage layer. This accomplishes a low-voltage operation. In a floating gate type memory, on the other hand, an inter-poly-Si insulating film exists between a control gate electrode and a floating gate layer. Therefore, a voltage applied to the gate electrode is not entirely applied to a tunnel oxide film but applied to both the inter-poly-Si insulating film and the tunnel oxide film. Accordingly, the operation requires a higher voltage than in the MONOS memory.

Figure 24A:
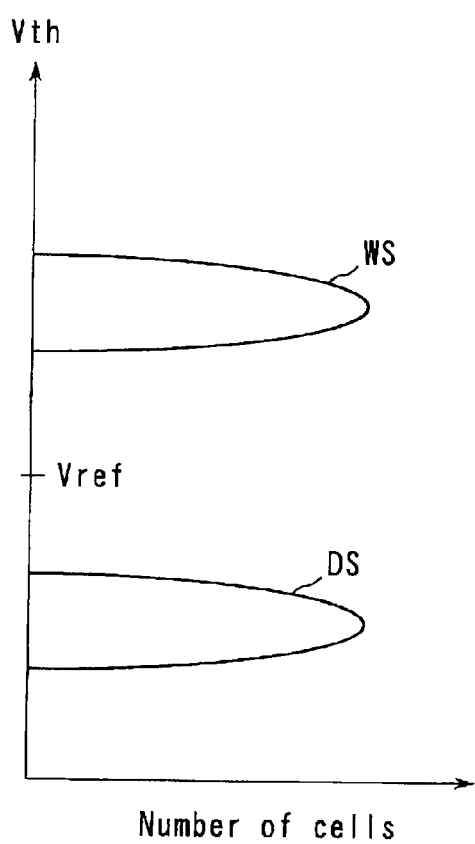
FIGS. 24A and 24B are graphs showing threshold voltage distributions corresponding to data storage states in a binary cell and a multi-valued cell, respectively.

The first to third embodiments have been explained by taking a binary memory cell as an example. FIG. 24A is a graph showing threshold voltage distributions corresponding to data storage states (an erased state DS and a written state WS) in a binary cell. A binary memory cell has the written state WS in which the threshold voltage is higher than Vref, and the erased state DS in which the threshold voltage is lower than Vref. Therefore, two states, i.e., "written" and "erased" states are stored in one memory cell.

Figure 24B:
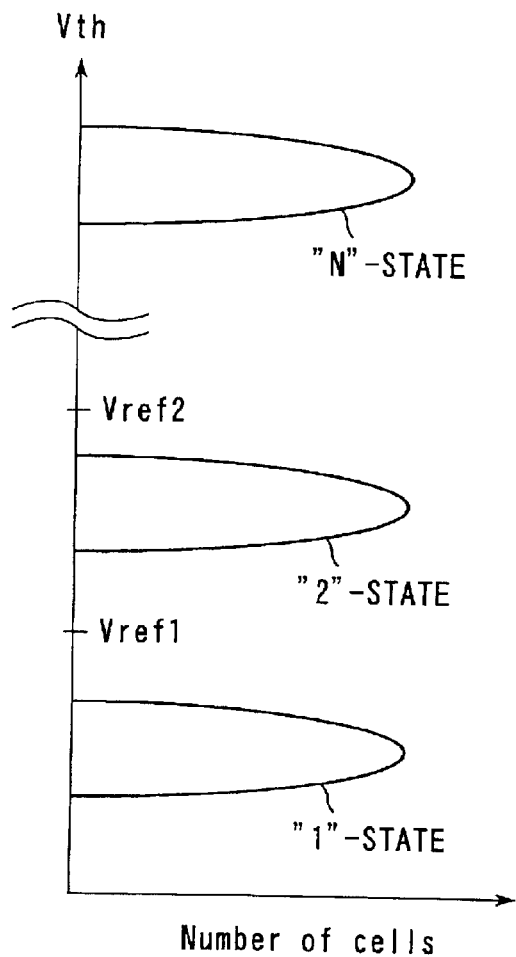

As a comparison, FIG. 24B is a graph showing threshold voltage distributions corresponding to data storage states in a multi-valued cell. A multi-valued cell has "1"-STATE, "2"-STATE, ..., "N"-STATE in ascending order of threshold voltage. Hence, N (N is a natural number of 2 or more) states are stored in one memory cell. Memories having this multi-valued memory cell can be practiced in the same manner as in the above embodiments by letting Vref1 denote a voltage for distinguishing between "1"-STATE and "2"-STATE, and regarding "erased state DS" of the binary memory cell as "1"-STATE of the multi-valued memory cell and "Vref" of the binary memory cell as "Vref1" of the multi-valued memory cell.

When the third embodiment is to be applied to this multi-valued memory cell, the threshold voltage Vthsg of a selection transistor can be made equal to one of "1"-STATE to "N"-STATE. Also, the same effects as in the third embodiment can be obtained by making a voltage to be supplied to a selection gate in read operation equal to one of Vref1 to VrefN-1 and Vread.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising a plurality memory elements, which are connected between at least two current terminals, and each of which comprises:

at least one control terminal which switches a ON state and OFF state of a current path between said current terminals; and an information storage portion interposed between said current path and said control terminal to provide a threshold voltage which is a voltage of said control terminal when the ON state and OFF state of said current path are switched, wherein said information storage portion selectively stores electrically erasable and programmable discrete N-valued (N is an integer of not less than 2) data, said information storage portion provides, as the threshold voltage, first to Nth threshold voltages which are discrete in ascending order of voltage in correspondence with the N-valued data, all the first to Nth threshold voltages of said plurality of memory elements are higher than the lower one of voltages applied to said current terminals in data read, and a voltage higher than the Nth threshold voltage is applied to at least one control terminal of said plurality of memory elements in data read.

2. A memory according to claim 1, wherein all the first to Nth threshold voltages of said plurality of memory elements are lower than a voltage applied to the control terminal of a non-selected one of said plurality of memory elements in data read.

3. A memory according to claim 1, wherein said plurality of memory elements are connected in series between said current terminals.

4. A memory according to claim 1, wherein the lower one of the voltages applied to said current terminals in data read is 0 V.

5. A memory according to claim 1, wherein the first to Nth threshold voltages comprise threshold voltages corresponding to an erased state and written state of said information storage portion, and the first threshold voltage corresponds to the erased state.

6. A memory according to claim 1, wherein said plurality of memory elements form a memory cell block, one terminal of said memory cell block is electrically connected to a first signal line, the other terminal of said memory cell block is electrically connected to a second signal line, and a potential of said first signal line is sensed by a data circuit in data read.

7. A memory according to claim 6, wherein said memory cell block is a NAND memory cell block comprising a plurality of memory cell elements connected in series between said current terminals, and selection elements connected to opposite ends of said plurality of memory cell elements.

8. A memory according to claim 1, wherein said memory element comprises a transistor, said transistor comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and
wherein said charge storage layer comprises a floating gate layer including a conducting film.

9. A memory according to claim 1, wherein said memory element comprises a transistor, said transistor comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and
wherein said charge storage layer is insulating, and said transistor comprises a gate insulating film with a stacked structure including a lower insulating film formed on said semiconductor substrate and an upper insulating film formed on said lower insulating film and functioning as said charge storage layer.

10. A memory according to claim 9, wherein said charge storage layer includes an insulating film containing silicon and nitrogen as main elements.

11. A memory according to claim 9, wherein said insulating film of said charge storage layer has a physical film thickness of not more than 15 nm.

12. A memory according to claim 9, wherein said charge storage layer is formed on said semiconductor substrate via an insulating film having a thickness of not more than 4 nm.

13. A memory according to claim 9, wherein when an erase operation is performed for said memory element, positive charge is injected from an entire channel surface into said charge storage layer by direct tunneling.

14. A memory according to claim 9, wherein when an erase operation is performed for said memory element, source or drain, or the source and drain of said transistor are positively biased with respect to a well, and said control gate electrode is negatively biased with respect to the well, to inject hot holes into said charge storage layer.

15. A semiconductor memory comprising a plurality memory elements, which are connected between at least two current terminals, and each of which comprises:
at least one control terminal which switches a ON state and OFF state of a current path between said current terminals; and
an information storage portion interposed between said current path and said control terminal to provide a threshold voltage which is a voltage of said control terminal when the ON state and OFF state of said current path are switched,
wherein said information storage portion selectively stores electrically erasable and programmable discrete N-valued (N is an integer of not less than 2) data,
said information storage portion provides, as the threshold voltage, first to Nth threshold voltages which are discrete in ascending order of voltage in correspondence with the N-valued data, and
memory elements of said plurality of memory elements, which store Mth (M is an integer from 1 to N (both inclusive)) data states, comprise memory elements whose threshold voltages are higher, and memory elements whose threshold voltages are lower, than the lower one of voltages applied to said current terminals in data read.

16. A memory according to claim 15, wherein a voltage higher than the Nth threshold voltage is applied to at least one control terminal of said plurality of memory elements in data read.

17. A memory according to claim 15, wherein said plurality of memory elements are connected in series between said current terminals.

18. A memory according to claim 15, wherein a voltage applied to the control terminal of one, selected for data read, of said plurality of memory elements in data read is higher than the lower one of the voltages applied to said current terminals in data read.

19. A memory according to claim 15, wherein the lower one of the voltages applied to said current terminals in data read is 0 V.

20. A memory according to claim 15, wherein M is 1.

21. A memory according to claim 15, wherein said plurality of memory elements form a memory cell block, one terminal of said memory cell block is electrically connected to a first signal line, the other terminal of said memory cell block is electrically connected to a second signal line, and a potential of said first signal line is sensed by a data circuit in data read.

22. A memory according to claim 21, wherein said memory cell block is a NAND memory cell block comprising a plurality of memory cell elements connected in series between said current terminals, and selection elements connected to opposite ends of said plurality of memory cell elements.

23. A memory according to claim 15, wherein said memory element comprises a transistor, said transistor comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and wherein said charge storage layer comprises a floating gate layer including a conducting film.

24. A memory according to claim 15, wherein said memory element comprises a transistor, said transistor comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and wherein said charge storage layer is insulating, and said transistor comprises a gate insulating film with a stacked structure including a lower insulating film formed on said semiconductor substrate and an upper insulating film formed on said lower insulating film and functioning as said charge storage layer.

25. A memory according to claim 24, wherein said insulating film of said charge storage layer has a physical film thickness of not more than 15 mm.

26. A memory according to claim 24, wherein said charge storage layer is formed on said semiconductor substrate via an insulating film having a thickness of not more than 4 nm.

27. A memory according to claim 24, wherein when an erase operation is performed for said memory element, positive charge is injected from an entire channel surface into said charge storage layer by direct tunneling.

28. A memory according to claim 24, wherein when an erase operation is performed for said memory element, source or drain, or the source and drain of said transistor are positively biased with respect to a well, and said control gate electrode is negatively biased with respect to the well, to inject hot holes into said charge storage layer.

29. A semiconductor memory comprising a selection element and a memory element connected between at least two current terminals, said selection element having a selection element threshold voltage as a voltage of a selection control terminal when a ON state and OFF state of a current path between said current terminals is switched, said memory element comprising:

at least one control terminal which switches the ON state and OFF state of said current path between said current terminals; and an information storage portion interposed between said current path and said control terminal to provide a threshold voltage which is a voltage of said control terminal when the ON state and OFF state of said current path are switched, wherein said information storage portion selectively stores electrically erasable and programmable discrete N-valued (N is an integer of not less than 2) data, said information storage portion provides, as the threshold voltage, first to Nth threshold voltages which are discrete in ascending order of voltage in correspondence with the N-valued data, and all the first to Nth threshold voltages of said memory element are higher than the selection element threshold voltage.

30. A memory according to claim 29, wherein the first to Nth threshold voltages comprise threshold voltages corresponding to an erased state and written state of said information storage portion, and the first threshold voltage corresponds to the erased state.

31. A memory according to claim 29, wherein said plurality of memory elements form a memory cell block, one terminal of said memory cell block is electrically connected to a first signal line, the other terminal of said memory cell block is electrically connected to a second signal line, and a potential of said first signal line is sensed by a data circuit in data read.

32. A memory according to claim 31, wherein said memory cell block is a block selected from the group including a NAND memory cell block comprising a plurality of memory cell elements connected in series between said current terminals, and selection elements connected to opposite ends of said plurality of memory cell elements; an AND memory cell block comprising a plurality of memory cell elements connected in parallel between said current terminals, and selection elements connected to opposite ends of said plurality of memory cell elements; and a NOR memory cell block comprising a plurality of memory cell elements connected in parallel and sharing a diffusion layer.

33. A memory according to claim 31, wherein said memory cell block is a virtual ground array memory cell block comprising a plurality of memory cell elements connected in parallel between said current terminals, and selection elements connected to opposite ends of said plurality of memory cell elements.

34. A memory according to claim 29, wherein each of said selection element and said memory element comprises a transistor, said transistor of said memory element comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and wherein said charge storage layer comprises a floating gate layer including a conducting film.

35. A memory according to claim 29, wherein each of said selection element and said memory element comprises a transistor, said transistor of said memory element comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and wherein said charge storage layer is insulating, and said transistor comprises a gate insulating film with a stacked structure including a lower insulating film formed on said semiconductor substrate and an upper insulating film formed on said lower insulating film and functioning as said charge storage layer.

36. A memory according to claim 35, wherein said charge storage layer includes an insulating film containing silicon and nitrogen as main elements.

37. A memory according to claim 35, wherein said insulating film of said charge storage layer has a physical film thickness of not more than 15 nm.

38. A memory according to claim 35, wherein said charge storage layer is formed on said semiconductor substrate via an insulating film having a thickness of not more than 4 nm.

39. A memory according to claim 35, wherein when an erase operation is performed for said memory element, positive charge is injected from an entire channel surface into said charge storage layer by direct tunneling.

40. A memory according to claim 35, wherein when an erase operation is performed for said memory element, source or drain, or the source and drain of said transistor are positively biased with respect to a well, and said control gate electrode is negatively biased with respect to the well, to inject hot holes into said charge storage layer.

41. A semiconductor memory comprising a selection element and a plurality of memory elements connected between at least two current terminals, said selection element having a selection element threshold voltage as a voltage of a selection control terminal when a ON state and OFF state of a current path between said current terminals is switched, each of said memory elements comprising:

at least one control terminal which switches the ON state and OFF state of said current path between said current terminals; and an information storage portion interposed between said current path and said control terminal to provide a threshold voltage which is a voltage of said control terminal when the ON state and OFF state of said current path are switched, wherein said information storage portion selectively stores electrically erasable and programmable discrete N-valued (N is an integer of not less than 2) data, said information storage portion provides, as the threshold voltage, first to Nth threshold voltages which are discrete in ascending order of voltage in correspondence with the N-valued data, and said plurality of memory elements comprise memory elements whose Mth (M is an integer from 1 to N (both inclusive)) threshold voltages are higher, and memory elements whose Mth threshold voltages are lower, than the selection element threshold voltage.

42. A memory according to claim 41, wherein M is 1.

43. A memory according to claim 41, wherein said plurality of memory elements form a memory cell block, one terminal of said memory cell block is electrically connected to a first signal line, the other terminal of said memory cell block is electrically connected to a second signal line, and a potential of said first signal line is sensed by a data circuit in data read.

44. A memory according to claim 43, wherein said memory cell block is a block selected from the group consisting of a NAND memory cell block comprising a plurality of memory cell elements connected in series between said current terminals, and selection elements connected to opposite ends of said plurality of memory cell elements; an AND memory cell block comprising a plurality of memory cell elements connected in parallel between said current terminals, and selection elements connected to opposite ends of said plurality of memory cell elements; and a NOR memory cell block comprising a plurality of memory cell elements connected in parallel and sharing a diffusion layer.

45. A memory according to claim 43, wherein said memory cell block is a virtual ground array memory cell block comprising a plurality of memory cell elements connected in parallel between said current terminals, and selection elements connected to opposite ends of said plurality of memory cell elements.

46. A memory according to claim 41, wherein each of said selection element and said memory element comprises a transistor, said transistor of said memory element comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and wherein said charge storage layer comprises a floating gate layer including a conducting film.

47. A memory according to claim 41, wherein each of said selection element and said memory element comprises a transistor, said transistor of said memory element comprises a charge storage layer formed on a semiconductor substrate via an insulating film, and a control gate electrode formed on said charge storage layer via an insulating film, and said charge storage layer and said control gate electrode function as said information storage portion and said control terminal, respectively, and wherein said charge storage layer is insulating, and said transistor comprises a gate insulating film with a stacked structure including a lower insulating film formed on said semiconductor substrate and an upper insulating film formed on said lower insulating film and functioning as said charge storage layer.

48. A memory according to claim 47, wherein said insulating film of said charge storage layer has a physical film thickness of not more than 15 nm.

49. A memory according to claim 47, wherein said charge storage layer is formed on said semiconductor substrate via an insulating film having a thickness of not more than 4 nm.

50. A memory according to claim 47, wherein when an erase operation is performed for said memory element, positive charge is injected from an entire channel surface into said charge storage layer by direct tunneling.

51. A memory according to clam 47, wherein when an erase operation is performed for said memory element, source or drain, or the source and drain of said transistor are positively biased with respect to a well, and said control gate electrode is negatively biased with respect to the well, to inject hot holes into said charge storage layer.

52. A semiconductor memory comprising a selection element and a memory element connected between at least two current terminals, said selection element having a selection element threshold voltage as a voltage of a selection control terminal when a ON state and OFF state of a current path between said current terminals is switched, said memory element comprising:

at least one control terminal which switches the ON state and OFF state of said current path between said current terminals; and an information storage portion interposed between said current path and said control terminal to provide a threshold voltage which is a voltage of said control terminal when the ON state and OFF state of said current path are switched, wherein said information storage portion selectively stores electrically erasable and programmable discrete N-valued (N is an integer of not less than 2) data, and voltages applied to said control terminal selected for data read and said selection control terminal in data read are substantially equal.

53. A memory according to claim 52, wherein said information storage portion provides, as the threshold voltage, first to Nth threshold voltages which are discrete in ascending order of voltage in correspondence with the N-valued data, and a voltage applied to said selection control terminal in data read is higher than a Kth (K is an integer from 1 to N−1 (both inclusive)) threshold voltage and lower than a (K+1)th threshold voltage.

54. A semiconductor memory comprising a selection element and a memory element connected between at least two current treminals, said selection element having a selection element threshold voltage as a voltage of a selection control terminal when a ON state and OFF state of a current path between said current terminals is switched, said memory element comprising:

at least one control terminal which switches the ON state and OFF state of said current path between said current terminals; and an information storage portion interposed between said current path and said control terminal to provide a threshold voltage which is a voltage of said control terminal when the ON state and OFF state of said current path are switched, wherein said ingormation storage portion selectively stores electrically erasable and programmable discrete N-valued (N is an integer of not less then 2) data, and voltages applied to said control terminal selected for data read and said selection control terminal in data read are substantially equal, said information storage portion provides, as the threshold voltage, first to Nth threshold voltages which are discrete in ascending order of voltage in correspondence with the N-valued data, and a voltage applied to said selection control terminal in data read is higher than the Nth threshold voltage of said memory element.

* * * * *